(12) United States Patent
Choi et al.

(10) Patent No.: US 7,369,027 B2
(45) Date of Patent: May 6, 2008

(54) HIGH FREQUENCY MAGNETIC THIN FILM, COMPOSITE MAGNETIC THIN FILM AND MAGNETIC DEVICE USING THEM

(75) Inventors: Kyung-Ku Choi, Tokyo (JP); Taku Murase, Tokyo (JP); Yohtaro Yamazaki, Yokohama (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/696,622

(22) Filed: Apr. 4, 2007

(65) Prior Publication Data

US 2007/0183923 A1    Aug. 9, 2007

Related U.S. Application Data

(63) Continuation of application No. 10/502,490, filed as application No. PCT/JP03/00163 on Jan. 10, 2003, now Pat. No. 7,224,254.

(30) Foreign Application Priority Data

| Jan. 16, 2002 | (JP) | ............................. 2002-007059 |
| Apr. 19, 2002 | (JP) | ............................. 2002-117079 |
| Dec. 18, 2002 | (JP) | ............................. 2002-366192 |

(51) Int. Cl.
*H01F 5/00* (2006.01)

(52) U.S. Cl. ................................................... 336/200

(58) Field of Classification Search ................. 336/65, 336/83, 200, 206–208, 233–234; 428/692
See application file for complete search history.

(56) References Cited

U.S. PATENT DOCUMENTS

| 5,403,457 A | * | 4/1995 | Nago et al. | ............... 204/192.2 |
| 5,837,392 A | | 11/1998 | Katori et al. | ............... 428/692 |
| 6,004,654 A | | 12/1999 | Shinjo et al. | ............... 428/161 |
| 6,346,338 B1 | | 2/2002 | Watanabe et al. | ............ 428/692 |
| 6,351,119 B1 | | 2/2002 | Kawase | ....................... 324/249 |
| 6,420,042 B1 | | 7/2002 | Sakamoto et al. | ........... 428/469 |
| 6,649,286 B2 | | 11/2003 | Kim et al. | ................ 428/694 T |
| 6,841,259 B1 | | 1/2005 | Takahashi et al. | ........... 428/457 |
| 6,853,520 B2 | * | 2/2005 | Fukuzawa et al. | ........ 360/324.1 |
| 6,970,324 B2 | * | 11/2005 | Ikeda et al. | .................. 360/126 |
| 7,181,827 B2 | * | 2/2007 | Kamijima | ................. 29/603.07 |
| 2004/0239430 A1 | | 12/2004 | Cosentino et al. | ........... 330/311 |

FOREIGN PATENT DOCUMENTS

JP          63-065604          3/1988

(Continued)

*Primary Examiner*—Tuyen T. Nguyen
(74) *Attorney, Agent, or Firm*—Hogan & Hartson LLP

(57) ABSTRACT

A high frequency magnetic thin film characterized by comprising a first layer made of a T-L composition (here, T is Fe or FeCo, and L is one or more of C, B, and N) and a second layer comprising a Co-based amorphous alloy arranged on either of the surfaces of the first layer. The high frequency magnetic thin film is a multilayer film of a plurality of the first layers and a plurality of the second layers or desirably is a multilayer film of alternately laminated first and second layers. The high frequency magnetic thin film of the present invention exhibits the properties such that the real part ($\mu'$) of the complex permeability is 400 or more at 1 GHz, a quality factor Q ($Q=\mu'/\mu''$) is 4 or more, and a saturation magnetization is 14 kG (1.4 T) or more.

17 Claims, 18 Drawing Sheets

FOREIGN PATENT DOCUMENTS

| | | |
|---|---|---|
| JP | 02-143510 | 6/1990 |
| JP | 06-13236 | 1/1994 |
| JP | 06-069032 | 3/1994 |
| JP | 07-029732 | 1/1995 |

* cited by examiner

FIG. 24

| | Magnetic thin film configuration | T1 (nm) | T1/T2 | Saturation magnetization (T) | Anisotropy field (Oe) | Resonance frequency (GHz) | μ' (at 1GHz) | μ'' (at 1GHz) | Q (at 1GHz) | Resistivity (μΩcm) | Coercivity Hce (Oe) |
|---|---|---|---|---|---|---|---|---|---|---|---|
| Example 1 | (20nm CoZrNb/5nm Fe-C$_5$) × 20 | 5 | 0.25 | 1.47 | 45 | >>2.0 | 405 | 30 | 13 | 90 | 1.1 |
| Example 2 | (20nm CoZrNb/20nm Fe-C$_5$) × 13 | 20 | 1.00 | 1.63 | 44 | >>2.0 | 540 | 115 | 4.7 | 60 | 1.2 |
| Example 3 | (20nm CoZrNb/50nm Fe-C$_5$) × 7 | 50 | 2.50 | 1.67 | 48 | >>2.0 | 500 | 80 | 6.2 | 50 | 1.6 |
| Example 4 | (20nm CoZrNb/2nm Fe-C$_5$) × 20 | 2 | 0.10 | 1.25 | 20 | 1.5 | 900 | 700 | 1.3 | 100 | 1.1 |
| Example 5 | (20nm CoZrNb/80nm Fe-C$_5$) × 20 | 80 | 4.00 | 1.80 | 92 | >>2.0 | 200 | 25 | 8 | 48 | 2.8 |
| Example 6 | (20nm CoZrNb/5nm Fe-C$_7$) × 20 | 5 | 0.25 | 1.47 | 42 | >>2.0 | 410 | 30 | 14 | 90 | 1.0 |
| Example 7 | (20nm CoZrNb/5nm Fe-C$_{10}$) × 20 | 5 | 0.25 | 1.45 | 40 | >>2.0 | 490 | 45 | 11 | 88 | 1.0 |
| Comparative Example 1 | (20nm CoZrNb/50nm Fe) × 20 | — | — | 1.76 | 28 | 1.8 | 120 | 30 | 4 | 42 | 18.0 |
| Example 8 | (20nm CoZrTa/5nm Fe-C$_5$) × 20 | 5 | 0.25 | 1.49 | 44 | >>2.0 | 455 | 40 | 11 | 85 | 1.1 |
| Example 9 | (20nm CoFeZrB/5nm Fe-C$_5$) × 20 | 5 | 0.25 | 1.47 | 48 | >>2.0 | 410 | 35 | 12 | 105 | 1.2 |
| Comparative Example 2 | 500nm Co$_{87}$Zr$_5$Nb$_8$ | — | — | 1.15 | 15 | 1.25 | 1091 | 1068 | 1 | 120 | 0.8 |
| Comparative Example 3 | 1000nm Co$_{89}$Zr$_6$Ta$_5$ | — | — | 1.30 | 16 | 1.3 | 325 | 612 | 0.5 | 101 | 0.9 |
| Comparative Example 4 | 1000nm Co$_{79}$Fe$_9$Zr$_2$Ta$_{10}$ | — | — | 1.10 | 36 | 1.8 | 327 | 191 | 1.7 | 125 | 1.1 |

FIG. 25

| | Magnetic thin film configuration | T1 (nm) | T1/T2 | Saturation magnetization (T) | Resonance frequency (GHz) | μ' (at 1GHz) | μ" (at 1GHz) | Q (at 1GHz) | Resistivity (μΩcm) | Coercivity Hce (Oe) |
|---|---|---|---|---|---|---|---|---|---|---|
| Example 10 | (1.0nm CoZrNb/1.0nm Fe–C$_5$) × 250 | 1.0 | 1.0 | 1.43 | >>2.0 | 515 | 35 | 15 | 150 | 0.6 |
| Example 11 | (1.5nm CoZrNb/1.5nm Fe–C$_5$) × 170 | 1.5 | 1.0 | 1.55 | ~2.0 | 720 | 55 | 13 | 130 | 0.6 |
| Example 12 | (1.0nm CoZrNb/2.0nm Fe–C$_5$) × 170 | 2.0 | 2.0 | 1.48 | >>2.0 | 590 | 25 | 24 | 145 | 0.7 |
| Example 13 | (1.0nm CoZrNb/2.8nm Fe–C$_5$) × 170 | 2.8 | 2.8 | 1.50 | >>2.0 | 550 | 25 | 22 | 140 | 0.8 |
| Example 14 | (0.8nm CoZrNb/2.8nm Fe–C$_5$) × 140 | 2.8 | 3.5 | 1.58 | >>2.0 | 400 | 25 | 16 | 140 | 0.9 |
| Example 15 | (2.0nm CoZrNb/1.0nm Fe–C$_5$) × 170 | 1.0 | 0.5 | 1.39 | 1.7 | 755 | 130 | 6 | 125 | 0.6 |
| Comparative Example 5 | (1.0nm CoZrNb/1.0nm Fe) × 250 | — | — | 2.07 | — | 150 | — | — | 70 | 4.2 |
| Example 16 | (1.0nm CoZrNb/1.0nm Fe–C$_7$) × 250 | 1.0 | 1.0 | 1.41 | >2.0 | 600 | 50 | 12 | 140 | 0.6 |
| Example 17 | (1.0nm CoZrNb/1.0nm Fe–C$_{10}$) × 250 | 1.0 | 1.0 | 1.40 | ~2.0 | 750 | 60 | 12 | 130 | 0.6 |
| Example 18 | (1.0nm CoZrTa/1.0nm Fe–C$_5$) × 250 | 1.0 | 1.0 | 1.44 | >>2.0 | 520 | 35 | 15 | 150 | 0.6 |
| Example 19 | (1.0nm CoFeZrB/1.0nm Fe–C$_5$) × 250 | 1.0 | 1.0 | 1.50 | >>2.0 | 530 | 30 | 17 | 140 | 0.6 |

FIG. 26

| | Magnetic thin film configuration | T1 (nm) | T1/T2 | Saturation magnetization (T) | Anisotropy field (Oe) | Resonance frequency (GHz) | μ' (at 1GHz) | μ" (at 1GHz) | Q (at 1GHz) | Resistivity (μΩcm) | Coercivity Hce (Oe) |
|---|---|---|---|---|---|---|---|---|---|---|---|
| Example 20 | (20nm CoZrNb/5nm FeCo-C$_5$) × 20 | 5 | 0.25 | 1.65 | 45 | >>2.0 | 420 | 30 | 14 | 91 | 1.3 |
| Example 21 | (20nm CoZrNb/5nm Fe-B$_5$) × 20 | 5 | 0.25 | 1.50 | 45 | >>2.0 | 400 | 30 | 13 | 90 | 1.1 |
| Example 22 | (20nm CoZrNb/5nm Fe-Co-B$_5$) × 20 | 5 | 0.25 | 1.62 | 43 | >>2.0 | 410 | 35 | 12 | 88 | 1.2 |
| Example 23 | (20nm CoZrNb/5nm Fe-C$_5$-N$_5$) × 20 | 5 | 0.25 | 1.51 | 40 | >>2.0 | 420 | 35 | 12 | 93 | 1.0 |
| Example 24 | (20nm CoZrNb/5nm Fe-Co-C$_5$-N$_5$) × 20 | 5 | 0.25 | 1.62 | 40 | >>2.0 | 400 | 25 | 16 | 92 | 1.1 |
| Example 25 | (20nm CoZrNb/5nm Fe-Co-C$_2$-B$_2$) × 20 | 5 | 0.25 | 1.62 | 43 | >>2.0 | 410 | 35 | 12 | 89 | 1.1 |
| Example 26 | (20nm CoZrNb/2nm FeCo-C$_5$) × 20 | 2 | 0.10 | 1.51 | 42 | >>2.0 | 380 | 30 | 13 | 85 | 1.0 |
| Example 27 | (10nm CoZrNb/40nm FeCo-C$_5$) × 20 | 40 | 4.00 | 1.80 | 102 | >>2.0 | 350 | 30 | 12 | 48 | 1.9 |

HIGH FREQUENCY MAGNETIC THIN FILM, COMPOSITE MAGNETIC THIN FILM AND MAGNETIC DEVICE USING THEM

CROSS-REFERENCE TO THE RELATED APPLICATIONS

This is a continuation of application Ser. No. 10/502,490 filed Jan. 11, 2005 now U.S. Pat. No. 7,224,254, which is a national phase of international application No. PCT/JP03/00163 filed Jan. 10, 2003, the entire contents of which are incorporated by reference. This application also claims benefit of priority under 35 U.S.C. § 119 to Japanese Patent Application No. 2002-007059 filed Jan. 16, 2002, Japanese Patent Application No. 2002-117079 filed Apr. 19, 2002 and Japanese Patent Application No. 2002-366192 filed Dec. 18, 2002, the entire contents of all of which are incorporated by reference.

TECHNICAL FIELD

The present invention relates to a magnetic thin film which has high saturation magnetization, and exhibits high permeability and a high quality factor Q in the high frequency band of GHz range, in particular, high frequency planar magnetic devices such as a thin film inductor, a thin film transformer, or a magnetic thin film inductor used in a monolithic microwave integrated circuit (MMIC).

BACKGROUND ART

Miniaturization and sophistication of magnetic devices are followed by demand for magnetic thin film materials having high saturation magnetization and high permeability in the high frequency of GHz range.

For example, the monolithic microwave integrated circuit (MMIC), for which demand is growing mainly for use in wireless transmitters/receivers and portable information devices, is a high frequency integrated circuit having a configuration in which active elements such as transistors and passive elements such as transmission line, resistors, capacitors and inductors are integrated on a semiconductor substrate made of Si, GaAs, InP and the like.

In such an MMIC, the passive elements, in particular, the inductors and capacitors occupy larger areas than the active elements. The occupation of larger areas by the passive elements as a result leads to mass consumption of expensive semiconductor substrates, namely, the cost rise of the MMIC. Accordingly, now it is a challenge to reduce the areas occupied by the passive elements for the purpose of reducing the chip area and thereby lowering the manufacturing cost of the MMIC.

As the inductors used in MMICs, planar spiral coils are frequently used. In this connection, there has already been proposed a method (in other words, a method for obtaining an inductance comparable with a conventional inductance even by using a small occupied area) for increasing the inductance of such a spiral coil by inserting a soft magnetic thin film on the top and back sides or on one side of the spiral coil (for example, J. Appl. Phys., 85, 7919 (1999)).

However, for the purpose of applying a magnetic material to the inductor in an MMIC, it is demanded that firstly, a thin film magnetic material, which is high in permeability and low in loss in the high frequency of GHz range, should be developed. Additionally, high resistivity is also demanded for the purpose of reducing the eddy current loss.

So far, alloys comprising as the main component Fe or FeCo have been well known as materials having high saturation magnetization. However, when a magnetic thin film made of an Fe-based alloy or an FeCo-based alloy is prepared by means of a deposition technique such as the sputtering technique, the saturation magnetization of the film obtained is high, but the coercivity thereof is high and the resistivity thereof is low, so that satisfactory high frequency properties thereof can be hardly obtained.

On the other hand, Co-based amorphous alloys are known as materials excellent in soft magnetic properties. Such a Co-based amorphous alloy mainly comprises an amorphous substance comprising Co as the main component and one or more elements selected from the group consisting of Y, Ti, Zr, Hf, Nb, Ta and the like. However, when a Co-based amorphous alloy having zero magnetostriction composition is formed by means of a deposition technique such as the sputtering technique, the permeability of the film obtained is high, but the saturation magnetization thereof is of the order of 11 kG (1.1 T), and lower than those of Fe-based alloys. Additionally, for the frequencies higher than 100 MHz, the loss component (the imaginary part of the permeability, $\mu''$) becomes large and the quality factor Q comes to be 1 or less, so that the film concerned cannot be judged to be suitable as a magnetic material to be used in the high frequency of GHz region.

For the purpose of actualizing the inductor for use in the GHz region by use of such hardly applicable materials, an attempt has been made to shift the resonance frequency to the higher frequencies by micro-patterning a magnetic thin film so as to be increased in shape magnetic anisotropy energy (for example, J. Magnetics Soc. Japan, 24, 879 (2000)). However, this method involves a problem such that the production process tends to be complicated and additionally the effective permeability of the magnetic thin film is lowered.

Under such actual circumstances as described above, various proposals have hitherto been made for the purpose of improving the high frequency properties of the soft magnetic thin film. The fundamental guidelines for the improvement include the suppression of the eddy current loss and the increase of the resonance frequency. Specific measures for suppressing the eddy current loss which have been proposed include a multilayered configuration formation by alternately laminating a magnetic layer and an insulating layer (a high electric resistance layer) (for example, Japanese Patent Laid-Open No. 7-249516) and a granularization of metals and nonmetals (oxides, fluorides) (for example, J. Appl. Phys., 79, 5130 (1996)). However, the multilayer film methods involve the insertion of the high electric resistance nonmagnetic phase and hence lead to a problem such that the saturation magnetization is lowered. In the case of the metal-nonmetal granular film, a permeability is 200 or less, leading to a problem that the permeability is low.

On the other hand, high saturation magnetization thin films each made of a multilayer film formed by alternately laminating a soft magnetic layer and a high saturation magnetization layer has been investigated. More specifically, there have been reported various combinations such as CoZr/Fe (J. Magnetics Soc. Japan, 16, 285 (1992)), FeBN/FeN (Japanese Patent Laid-Open No. 5-101930), FeCrB/Fe (J. Appl. Phys., 67, 5131 (1990)), and Fe—Hf—C/Fe (J. Magnetics Soc. Japan, 15, 403 (1991)). Any one of these combinations has an effect of enhancing the saturation magnetization. However, any one of these combinations cannot yield high permeability in the high frequency region, no application to the GHz frequency region being able to be expected.

Under such actual circumstances as described above, the present invention has been invented and takes as its object the provision of a high frequency magnetic thin film having high permeability and high saturation magnetization in the high frequency of GHz region. Additionally, the present invention takes as its another object the provision of a magnetic device using such a magnetic thin film.

DISCLOSURE OF THE INVENTION

The high frequency magnetic thin film of the present invention can be used in the frequency region of several 100 MHz or more, in particular, 1 GHz or more. The permeability in such a high frequency region (hereinafter, simply referred to as "high frequency permeability") is a physical property related to various physical properties of the sample concerned in a complicated manner. Among such physical properties are the anisotropy field and the saturation magnetization which are most intimately related to the permeability. Approximately, the product of the permeability and the resonance frequency has a relation such that the product is proportional to the ½-th power of the anisotropy field and the ³⁄₂-th power of the saturation magnetization.

The resonance frequency is represented by the following relation (1):

$$f_x = (\gamma/2\pi)[H_k 4\pi M_s]^{1/2} \qquad (1)$$

where $f_r$ represents the resonance frequency, $\gamma$ represents the gyromagnetic constant, $H_k$ represents the anisotropy field and $4\pi M_s$ represents the saturation magnetization.

As the above mentioned, the resonance frequency can be increased by increasing the anisotropy magnetic field and the saturation magnetization of the material and thereby the usable limit frequency can be increased. Now, a calculation is made on the basis of the above formula (1) on the anisotropy magnetic field required for increasing up to 2 GHz the resonance frequency of the CoZrNb amorphous alloy thin film, which is a typical example of conventional Co-based amorphous alloy thin films. Consequently, the calculation reveals that the anisotropy magnetic field of 44 Oe (3501.52 A/m) or more is required. As can be seen from this calculated result, the film concerned which usually has an anisotropy magnetic field of the order of 15 Oe (1193.7 A/m) is hardly applicable to the GHz frequency region. On the other hand, the anisotropy magnetic field required for actualizing the resonance frequency of 2 GHz is 36 Oe (2864.88 A/m) for the saturation magnetization of 14 kG (1.4 T) and 28 Oe (2228.24 A/m) for the saturation magnetization of 18 kG (1.8 T); thus it can be expected that incorporation of an Fe-based alloy or an FeCo-based alloy, both high in saturation magnetization and magnetic crystalline anisotropy, realizes the required saturation magnetization and anisotropy magnetic field.

Alloys comprising as the main component Fe or FeCo have hitherto been widely known as materials exhibiting high saturation magnetization. However, when the magnetic thin film of an Fe-based alloy or an FeCo-based alloy is formed by means of a deposition technique such as the sputtering technique, the saturation magnetization of the film obtained is high, but the coercivity thereof is high and the resistivity thereof is low, so that satisfactory high frequency properties thereof can be hardly obtained. As the main reason for this, the following has been conceived. As shown in FIG. 2, the thin film 101 of the Fe-based alloy or the FeCo-based alloy, deposited by sputtering or the like, there occurs columnar growth along the direction perpendicular to a substrate 100, and the generation of the perpendicular magnetic anisotropy ascribable to the columnar structure becomes a problem.

However, as a result of the diligent study carried out by the present inventors, the following findings have been obtained on the Fe—C thin film in which Fe is added with a predetermined amount of C (carbon).

(1) An Fe—C thin film having a predetermined thickness has columnar structure, but when the thickness is of the order of 70 nm or less, excellent soft magnetic properties can be obtained because the aspect ratio of the columnar structure (the ratio of the column length to the column width, the length/the width) is small. More specifically, the average width of the grown Fe—C columns is about 50 nm, and the degradation of the soft magnetic properties due to the columnar structure can be suppressed as far as the thickness is of the order of 70 nm for which the aspect ratio of the columnar structure is 1.4 or less. For the purpose of obtaining an Fe—C thin film having such an aspect ratio, as shown in FIG. 3, it is effective that a Co-based amorphous alloy thin film 111 is interposed between an Fe—C thin film 112 and another Fe—C thin film 112. In this way, the continuous columnar growth of the Fe—C grains can be prevented.

(2) Elaborate examination of the growth process of the Fe—C thin film has revealed that a microcrystalline state of 3 nm or less in grain size is found in the early stage of the film growth with the film thickness of the order of 3 nm or less, and the unstable surface ratio is increased, so that the features of an amorphous substance are exhibited. More specifically, as shown in FIG. 4, the Fe—C thin film 121 is constituted with an amorphous structure portion 121a formed on the substrate 120 and a columnar structure portion 121b formed on the amorphous structure portion 121a. Being amorphous can be judged for the case of the Fe—C thin film, on the basis of the X-ray diffraction, from the absence of the diffraction peak ascribable to the Fe—C bcc (110) crystal plane. A thin film having such amorphous structure, needless to say, does not turn into columnar structure, and can yield high resistance (100 μΩcm or more) properties attributable to amorphous structure. Accordingly, adoption of a form in which the film concerned is laminated with a Co-based amorphous alloy thin film can actualize the soft magnetic properties, needless to say, and high resistance, so that a magnetic thin film high in permeability in the GHz frequency region, suppressed in eddy current loss and high in quality factor can be obtained.

(3) The above described matters (1) and (2) are effective not only for the Fe—C thin film but also for the FeCo—C thin film, and moreover, even for the case where C is replaced with B or N.

In other words, as described above, the present invention has made it possible to provide a high frequency composite magnetic thin film which can easily attain the properties, in the GHz region (1 GHz), such as the real part (μ') of the permeability of 200 or more, the quality factor Q (Q=μ'/μ") of 1 or more and the saturation magnetization of 12 kG (1.2 T) or more, by laminating a Co-based amorphous alloy thin film excellent in soft magnetic properties and an Fe—(C, B, N) thin film or an FeCo—(C, N, B) thin film, both having high saturation magnetization and high magnetic anisotropy field.

Accordingly, the present invention provides a high frequency magnetic thin film, characterized in that the thin film comprises a first layer made of a T-L composition (here, T is Fe or FeCo, L is one or more of C, B and N) and a second layer made of a Co-based amorphous alloy arranged on either of the surfaces of the first layer.

It is preferable that the high frequency magnetic thin film of the present invention is constituted with a multilayer film structure in which a plurality of the first layers and a plurality of the second layers are laminated, more preferably they are alternately laminated.

It should be noted that these properties can be obtained for the thin film as deposited. In other words, the time elapsed from completion of deposition is not concerned, but on the basis of the values measured after deposition without being subjected to, for example, heat treatment and the like, the judgment as to whether the properties specified by the present invention are provided or not can be made. Incidentally, even in the case where heat treatment and the like are applied after deposition, those thin films which are provided with the properties specified by the present invention are, needless to say, included within the scope of the present invention. The same is applicable to what follows.

The properties concerned can be obtained by regulating the thickness of the first and second layers. Specifically, in the case where the thickness of the first layer is denoted by T1 and the thickness of the second layer is denoted by T2, the above described properties can be obtained by making T1 fall within the range from 3 to 70 nm, and by making T1/T2 fall within the range from 0.15 to 3.50.

The properties concerned can be obtained by regulating the thickness of the first and second layers. Specifically, in the case where the thickness of the first layer is denoted by T1 and the thickness of the second layer is denoted by T2, the above described properties can be obtained by making T1 fall within the range from 0.5 to 3.0 nm, and by making T1/T2 fall within the range from 0.8 to 3.0.

Additionally, as a preferable mode of the present invention, the Co-based amorphous alloy constituting the second layer is formed in such a way that the alloy is mainly composed of Co, and contains at least one additional element selected from the group consisting of B, C, Si, Ti, V, Cr, Mn, Fe, Ni, Y, Zr, Nb, Mo, Hf, Ta and W.

Additionally, as another preferable mode of the present invention, the Co-based amorphous alloy is constituted in such a way that the alloy is selected from the group consisting of CoZr, CoHf, CoNb, CoMo, CoZrNb, CoZrTa, CoFeZr, CoFeNb, CoTiNb, CoZrMo, CoFeB, CoZrNbMo, CoZrMoNi, CoFeZrB, CoFeSiB, and CoZrCrMo.

Additionally, as another preferable mode of the present invention, the first layer is constituted in such a way that the concentration of the element L contained therein is 2 to 20 at %.

According to the present invention described above, there is provided a composite magnetic thin film in which alternately laminated are the first layer mainly composed of Fe or FeCo and having, as a single layer film, a saturation magnetization of 16 kG (1.6 T) or more, and the second layer mainly composed of Co and having, as a single layer film, a permeability of 1,000 or more (the measurement frequency: 10 MHz), a saturation magnetization of 10 kG (1.0 T) or more and a resistivity of 100 μΩcm or more are alternately laminated. It is preferable that the first layer is mainly constituted with a columnar structure of 1.4 or less in aspect ratio or is constituted with an amorphous structure.

The high frequency magnetic thin film of the present invention can be used as a constituent element of a magnetic device. The high frequency magnetic thin film constituting this magnetic device is characterized in that the thin film is a multilayer film comprising a first layer made of a T-L composition (here, T=Fe or FeCo, L=one or more of C, B and N) and a second layer made of a Co-based amorphous alloy arranged on either of the surfaces of the first layer alternately laminated.

The magnetic device of the present invention can be configured such that the element comprises high frequency magnetic thin films arranged to face each other and to sandwich a coil. Additionally, the magnetic device is a planar magnetic device, and the magnetic device can be made to be an inductor or a transformer. The application to the inductor used in a monolithic microwave integrated circuit can be cited as a preferable mode of the present invention.

BRIEF DESCRIPTION OF THE PRESENT INVENTION

FIG. 24 is a diagram showing the magnetic properties and the like of the magnetic thin films prepared in Examples 1 to 9 and Comparative Examples 1 to 4;

FIG. 25 is a diagram showing the magnetic properties and the like of the magnetic thin films prepared in Examples 10 to 19 and Comparative Example 5; and FIG. 26 is a diagram showing the magnetic properties and the like of the magnetic thin films prepared in Examples 20 to 27.

BEST MODE FOR CARRYING OUT THE INVENTION

Description will be made below on an embodiment of one aspect of the present invention.

Figure 1:
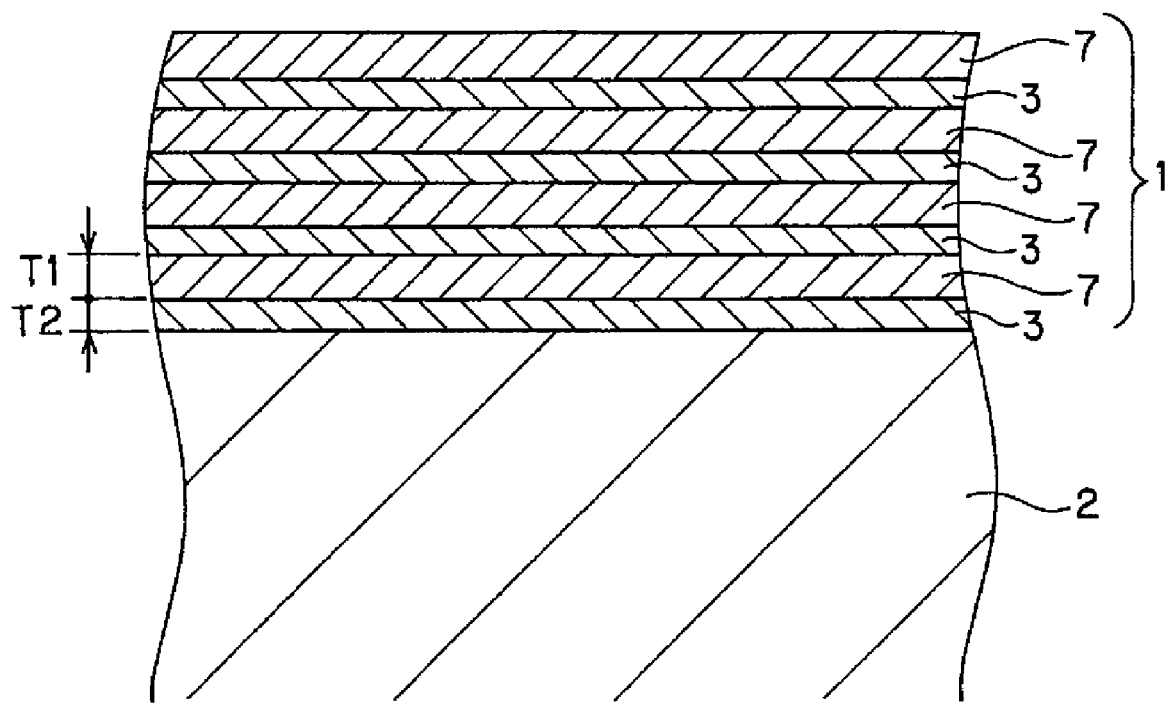
FIG. 1 is a cross-sectional view of a high frequency magnetic thin film of the present invention.
Figure 2:
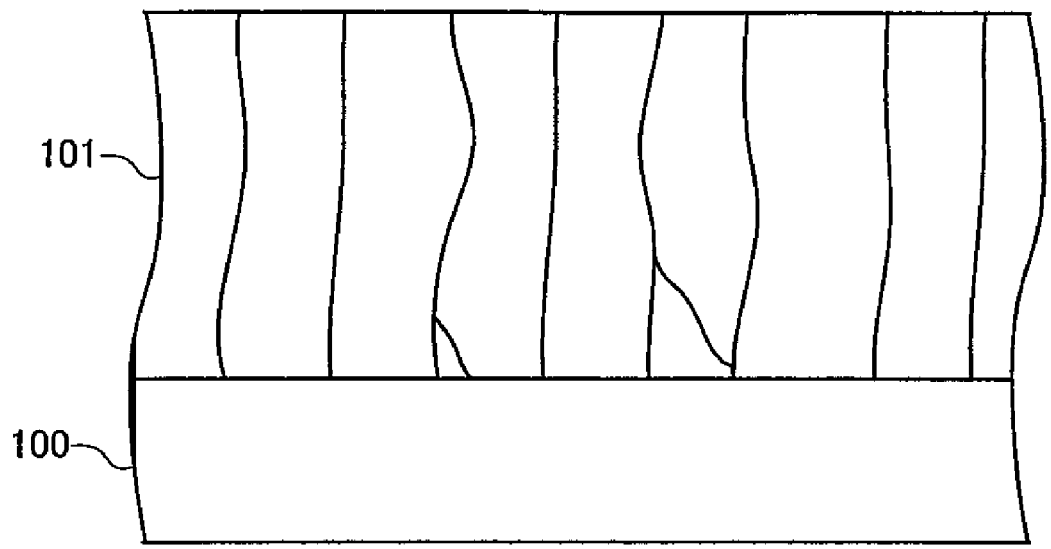
FIG. 2 is a schematic cross-sectional view showing the condition of the grains in an Fe-based thin film or an FeCo-based thin film.
Figure 3:
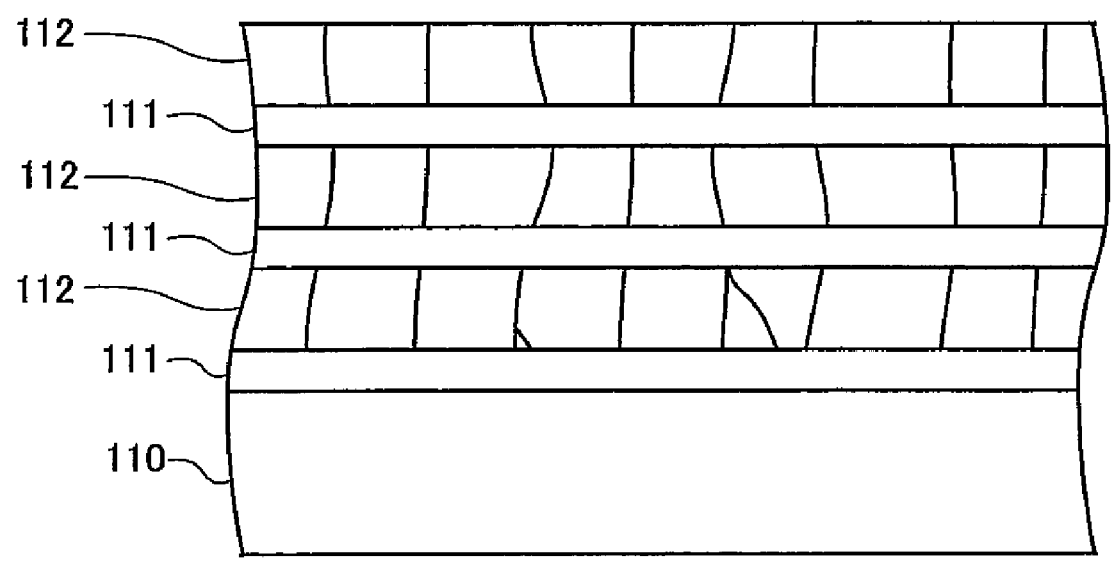
FIG. 3 is a schematic cross-sectional view showing the condition of the grains in an Fe—C thin film when an Fe—C thin layer and a Co-based amorphous alloy thin film are laminated.
Figure 4:
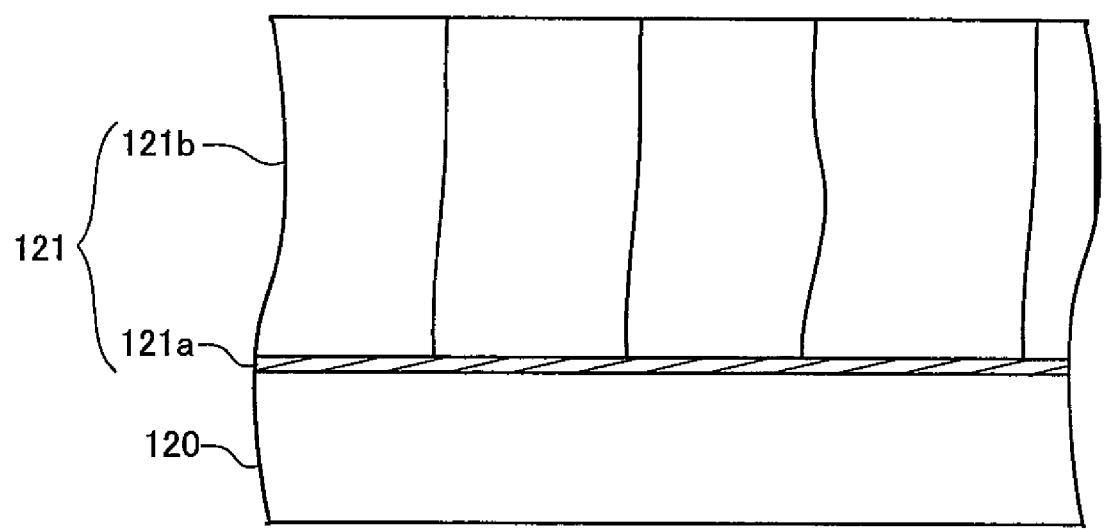
FIG. 4 is a partially enlarged cross-sectional view of FIG. 3.

The high frequency magnetic thin film 1 of the present invention is, as shown in a schematic cross-sectional view of FIG. 1, a composite magnetic thin film comprising a multilayer film configuration in which a Co-based amorphous alloy layer 3 and a T-L composition layer 7 are alternately laminated. In the embodiment shown in FIG. 1, a multilayer film configuration composed of 8 layers in total is shown as an example.

The high frequency magnetic thin film 1 has, as the fundamental configuration thereof, a combination of a T-L composition layer 7 and a Co-based amorphous alloy layer 3 arranged on one surface of the T-L composition layer 7.

The "T" in the T-L composition layer 7 is Fe or FeCo, and "L" is one or more of C, B and N. The thin film made of an alloy mainly composed of Fe or FeCo exhibits high saturation magnetization, but tends to be high in coercivity and low in resistivity. Accordingly, the present invention comprises the "L" (one or more of C, B and N) capable of improving the soft magnetic properties. The T-L composition layer 7 includes two different modes. One of the modes is the one having a columnar structure in which the aspect ratio of the T-L composition layer 7 is 1.4 or less; the actualization of this mode permits yielding a high saturation magnetization and excellent soft magnetic properties. The other mode is an amorphous structure; the actualization of the amorphous structure of the T-L composition layer 7 permits attaining a further improvement of the soft magnetic properties and a high electric resistance. For the purpose of achieving some effects in the high frequency properties, it is preferable that the T-L composition layer 7 has, as a single layer film, properties such that the saturation magnetization thereof is 1.6 T or more. Even in the mode having a columnar structure in which the aspect ratio of the T-L composition layer 7 is 1.4 or less, the amorphous structure is formed at the early stage of the thin film formation, and accordingly the columnar structure in the present invention should be interpreted as including this amorphous structure portion.

When the film thickness of the T-L composition layer 7 becomes large and the aspect ratio thereof exceeds 1.4 to be 2.0 or more, the perpendicular magnetic anisotropy exhibits itself strongly and the soft magnetic properties are deteriorated. In the present invention, it is most preferable that the aspect ratios of all the grains present in the T-L composition layer 7 are 1.4 or less; however, the present invention admits the partial inclusion of the grains of 30% or less, and moreover, 10% or less in the aspect ratio increment. Accordingly, in the present invention, the thickness (T1) of the T-L composition layer 7 is made to be 100 nm or less, preferably 70 nm or less. As described above, when T1 is 3 nm or less, the T-L composition layer 7 comes to take an amorphous structure, and no performance degradation of the layer takes place even when T1 is decreased down to, for example, 0.2 nm. However, if T1 is too small, the number of the lamination operations is increased, leading to a problem in preparation such that the total deposition time is elongated. Consequently, it is preferable that T1 is 0.5 nm or more, and furthermore, 1.0 nm or more.

Figure 5:
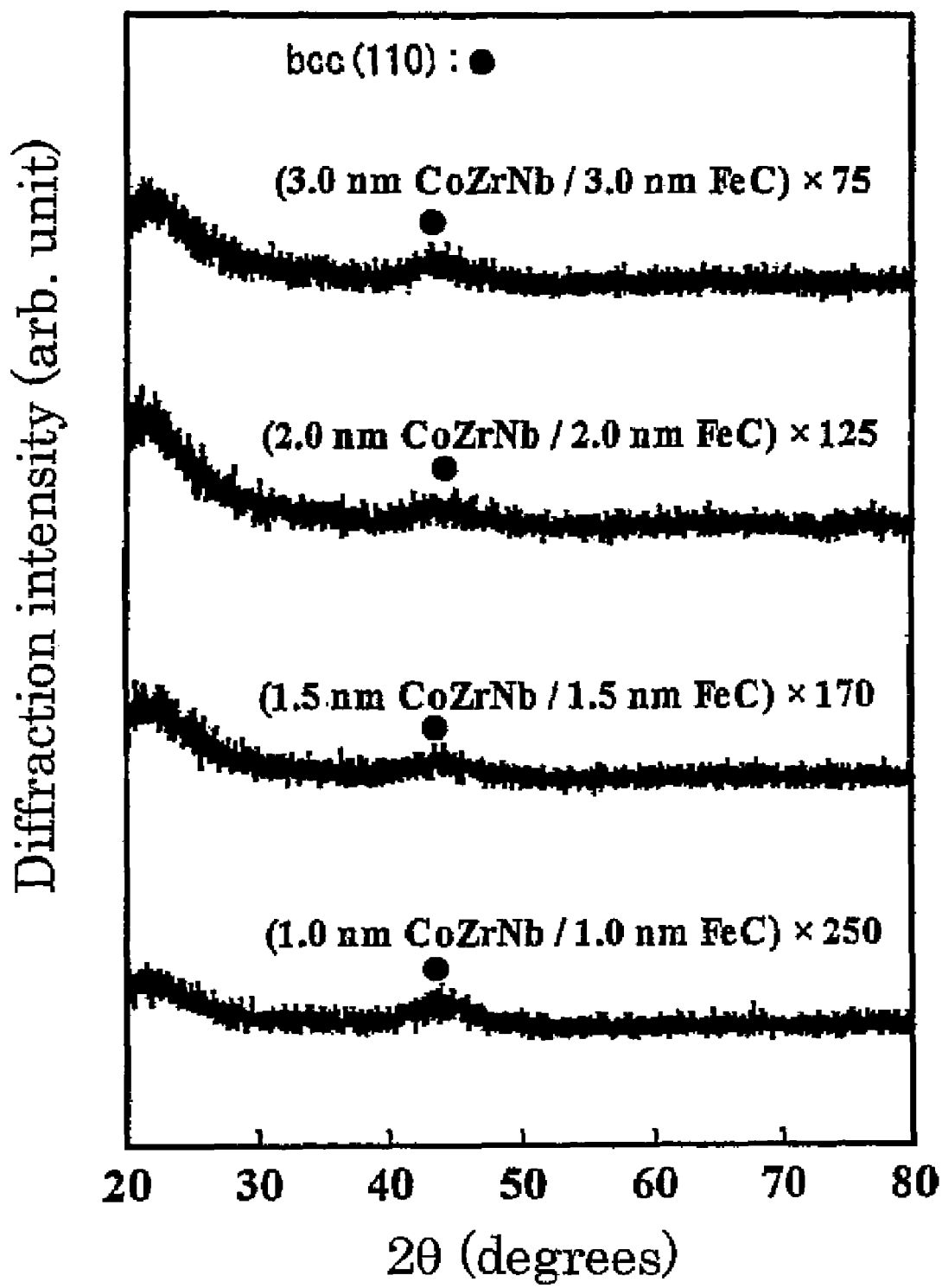
FIG. 5 is a graph showing the X-ray diffraction results of a composite magnetic thin film in which an Fe—C thin film of 3 nm or less in the thickness T1 and a CoZrNb amorphous alloy thin film are laminated.

FIG. 5 shows the X-ray diffraction results of a composite magnetic thin film in which an Fe—C thin film of 3 nm or less in the thickness T1 and a CoZrNb amorphous alloy thin film are laminated. As shown in FIG. 5, the laminates of 3 nm or less in the thickness of the Fe—C thin film each showed diffraction peak of the bcc (110) crystal plane of the Fe—C system having a typical broad shape for an amorphous system.

In the T-L composition layer 7 of the present invention, the concentration of the L element(s) (one or more of C, B and N) contained therein is 2 to 20 at %, preferably 4 to 10 at %. When the L element concentration is less than 2 at %, there tends to occur the columnar growth of the bcc structure perpendicularly to the substrate, the coercivity becomes high, and the resistivity comes to be low, making it difficult to obtain satisfactory high frequency properties. On the other hand, when the L element concentration exceeds 20 at %, the an isotropic magnetic filed is decreased and hence the resonance frequency is lowered, so that sufficient functioning as a thin film for use in high frequency applications becomes difficult. Additionally, the adoption of FeCo as T rather than the adoption of only Fe is preferable because a high saturation magnetization can be thereby obtained. In this case, the Co content may be determined within the range of 80 at % or less, and the content falling within the range from 20 to 50 at % is preferable. The present invention admits the inclusion of other elements within the range giving no adverse effect on the present invention.

The use of the Co-based amorphous alloy in the present invention as the second layer is based on the fact that the alloy is high in permeability and high in resistance (the resistivity is 100 to 200 μΩcm) and hence the eddy current loss in the high frequency region can be suppressed. The use of the amorphous alloy also based on the fact that when the second layer is made of a crystalline material, the first layer above and in contact with the second layer sees the grain growth thereof affected by the grain structure of the second layer, resulting in forming a continuous columnar structure, while when the second layer is made of an amorphous material, even if the first layer is of the columnar structure, the columnar growth is blocked by the second layer, resulting in no continuous columnar structure. It is preferable that the Co-based amorphous alloy layer 3 has the properties, as a single layer film, such that a permeability is 1,000 or more (10 MHz), a saturation magnetization is 10 kG (1.0 T) or more, and a resistivity is 100 μΩcm or more.

The Co-based amorphous alloy layer 3 as the second layer of the present invention is formed in such a way that the alloy layer is mainly composed of Co, and contains at least one additional element selected from the group consisting of B, C, Si, Ti, V, Cr, Mn, Fe, Ni, Y, Zr, Nb, Mo, Hf, Ta and W, the alloy layer being mainly constituted with an amorphous phase. The proportion of the additional element(s) (the total proportion when more than one additional elements are added) is usually 5 to 50 at %, preferably 10 to 30 at %. When the proportion of the additional element(s) is too high, there occurs a problem that the saturation magnetization comes to be low, while when the proportion of the additional element(s) is too low, there occurs a problem that the control of the magnetostriction becomes difficult and no effective soft magnetic properties can be obtained.

Examples of the preferable composition systems for constituting the Co-based amporphous alloy layer 3 include CoZr, CoHf, CoNb, CoMo, CoZrNb, CoZrTa, CoFeZr, CoFeNb, CoTiNb, CoZrMo, CoFeB, CoZrNbMo, CoZrMoNi, CoFeZrB, CoFeSiB, and CoZrCrMo.

By alternately laminating the above described T-L composition layer 7 and the above described Co-based amorphous alloy layer 3, there canbe obtained the high frequency magnetic thin film 1 in which the real ($\mu'$) part of the complex permeability at 1 GHz is 400 or more, the quality factor Q ($Q=\mu'/\mu''$) is 4 or more, and the saturation magnetization is 14 kG (1.4 T) or more. Incidentally, in the GHz region (1 GHz), the real ($\mu'$) part of the complex permeability is demanded to take a value as high as possible, and no particular upper limit is imposed thereon. Similarly, the saturation magnetization is also demanded to take a value as high as possible, and no particular upper limit is imposed thereon.

For the purpose of attaining the above described properties, with the thickness of the T-L composition layer 7 denoted by T1 and the thickness of the Co-based amorphous alloy layer 3 denoted by T2, it is important that T1 is made to fall within the range from 3 to 70 nm and T1/T2 is made to fall within the range from 0.15 to 3.50, preferably from 0.25 to 2.50. This is because when this value exceeds 3.50, the aspect ratio of the T-L composition layer 7 becomes high, the anisotropy magnetic field and the hard axis coercivity (Hch) is sharply increased, and accordingly the perpendicular magnetic anisotropy appears, so that particularly there occurs a problem that high quality soft magnetic properties cannot be obtained. This is also because when this value is less than 0.15, the saturation magnetization of 14 kG (1.4 T) or more cannot be obtained.

Additionally, by alternately laminating the above described T-L composition layer 7 and the above described Co-based amorphous alloy layer 3, there can be obtained a high frequency magnetic thin film 1 in which the real ($\mu'$) part of the complex permeability at 1 GHz is 500 or more, the quality factor Q ($Q=\mu'/\mu''$) is 10 or more, and the saturation magnetization is 14 kG (1.4 T) or more.

For the purpose of achieving the above described properties, with the thickness of the T-L composition layer 7 denoted by Ti and the thickness of the Co-based amorphous alloy layer 3 denoted by T2, T1 has only to be made to fall within the range from 0.5 to 3.0 nm, and T1/T2 has only to be made to fall within the range from 0.8 to 3.0.

When T1/T2 exceeds 3.0, the FeC grains grow large, and the resistivity of 130 $\mu\Omega$cm or more cannot be obtained. On the other hand, when this value is smaller than 0.8, the proportion of the T-L composition layer 7, being imparted high saturation magnetization, comes to be low, and the resonance frequency can hardly be shifted to the higher frequencies. Thus, T1/T2 is preferably 1.0 or more and 2.5 or less. By making the above described T1 and T1/T2 fall respectively within the ranges of the present invention, there can be actualize a composite thin film having extremely excellent properties such that the resistivity is 130 $\mu\Omega$cm or more, the real ($\mu'$) part of the complex permeability is 500 or more, the quality factor Q ($Q=\mu'/\mu''$) is 10 or more, and the saturation magnetization is 14 kG (1.4 T) or more, all at 1 GHz. Here, it should be noted that theses properties are measured, as described above, under the condition that deposition has been made but heat treatment and the like are not applied.

In the high frequency magnetic thin film 1 of the present invention, no particular constraint is imposed on the total number of the laminated T-L composition layers 7 and the laminated Co-based amorphous alloy layers 3, these two types of layers being alternately laminated; however, the total number of the laminated layers is usually 5 to 3,000, preferably of the order of 10 to 700. In the high frequency magnetic thin film 1, the same type of films (the T-L composition layers 7 or the Co-based amorphous alloy layers 3) are usually formed to be the same in film thickness. However, as rare cases, even the same type of films are possibly made to be different in deposition thickness depending on the lamination positions. As an extreme case, for example, there possibly is a specification such that the T-L composition layer 7 near the midway position is made to be 20 nm in thickness and each of the upper and bottom T-L composition layers 7 is made to be 5 nm in thickness as the case may be. In such a case, various numerical derivations may be made on the basis of the arithmetic mean thickness (Tf). In the above described example, for example, Tf/Tc (Tc is the arithmetic mean film thickness of the Co-based amorphous alloy layer 3) may be derived by adopting the arithmetic mean Tf=10 nm. Additionally, the high frequency magnetic thin film 1 of the present invention admits the arrangement of the layers other than the Co-based amorphous alloy layer 3 and the T-L composition layer 7.

The thickness of such a high frequency magnetic thin film 1 of the present invention is 100 to 2,000 nm, preferably 300 to 1,000 nm. When this value is less than 100 nm, in the case where the thin film is applied to a planar magnetic device, there possibly occurs a problem that a desired power can be hardly handled; additionally, as modes of core coils provided with the magnetic thin films, to be described later and shown in FIGS. 9 and 10, there is found a tendency such that the inductance increments as compared to the air core coils are less than 10%, causing a problem that the effect of the magnetic thin film cannot be sufficiently exhibited. On the other hand, when this value exceeds 2,000 nm, the high frequency loss due to the skin effect sharply becomes high, causing a problem that the loss in the GHz band is increased.

It is preferable that the high frequency magnetic film 1 of the present invention is formed by means of a vacuum thin film formation technique, in particular, the sputtering technique. More specifically, there are used the RF sputtering, DC sputtering, magnetron sputtering, ion beam sputtering, inductively coupled RF plasma assisted sputtering, ECR sputtering, faced-targets sputtering, and the like.

As the target for forming the Co-based amorphous alloy layer 3, a composite target may be used in which a pellet of a desired additional element is arranged on a Co target, and a target of a Co alloy containing a desired additional component may be used.

As the target for forming the T-L composition layer 7, a composite target may be used in which a pellet of an element L is arranged on an Fe (or an Fe—Co alloy) target, or a target of an alloy composed of Fe (or FeCo) and the element L may be used. The concentration regulation for the element L may be made, for example, by regulating the amount of the pellet of the element L.

Incidentally, sputtering is merely one possible mode of the present invention, and hence, needless to say, other thin film formation techniques can be applied. The examples to be described later can be referred to for the specific deposition methods applied to the high frequency magnetic thin film 1 of the present invention.

Examples of the substrate 2 (FIG. 1) on which the high frequency magnetic thin film 1 of the present invention is formed include glass substrate, ceramic material substrate, semiconductor substrate, resin substrate and the like. Examples of ceramic materials include alumina, zirconia, silicon carbide, silicon nitride, aluminum nitride, steatite, mullite, cordierite, forsterite, spinel and ferrite. It is preferable that, among these materials, aluminum nitride is used which is high both in thermal conductivity and in bending strength.

Additionally, the high frequency magnetic thin film 1 of the present invention has, as described above, extremely excellent high frequency properties and exhibit the performance thereof as deposited at room temperature, and accordingly, the thin magnetic film is a material most suitable for high frequency integrated circuits such as MMICs prepared by means of the semiconductor processes. Thus, examples of a substrate 11, a substrate 21 and a substrate 31 (shown in FIGS. 7, 8 and 10 to be described later) include semiconductor substrates such as Si, GaAs, InP and SiGe substrates.

Figure 6:
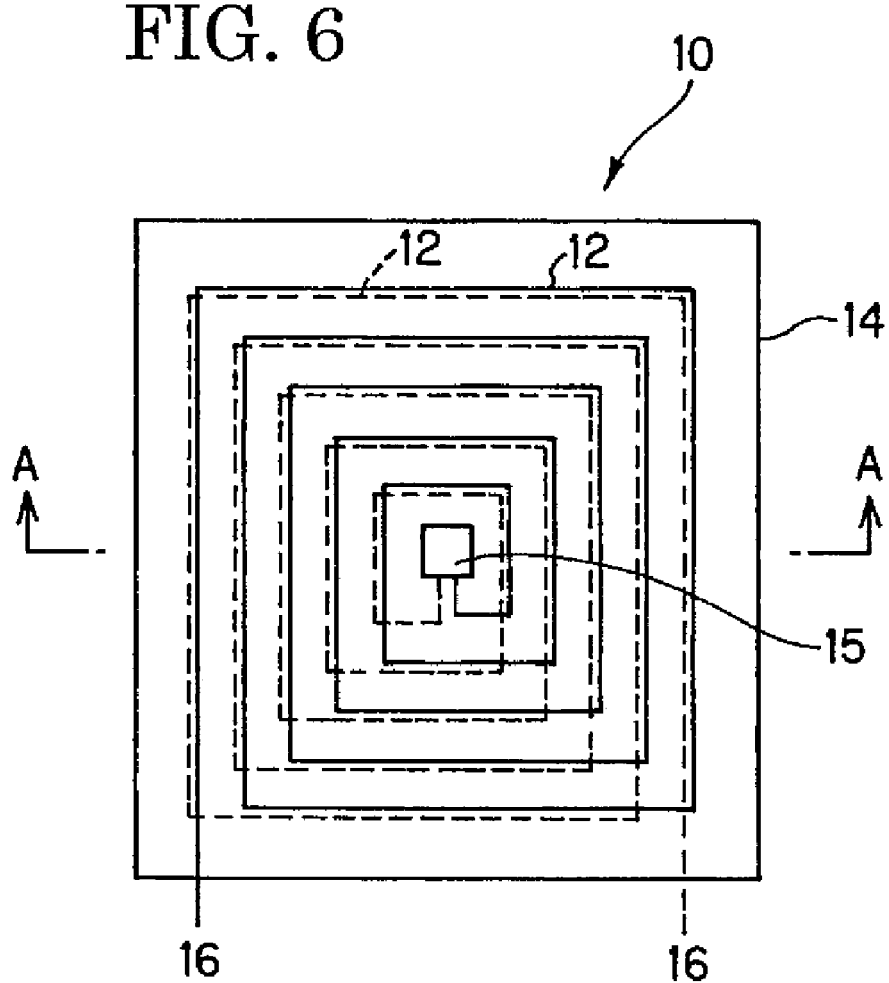
FIG. 6 is a plan view showing an example of an inductor to which a high frequency magnetic thin film of the present invention is applied.
Figure 7:
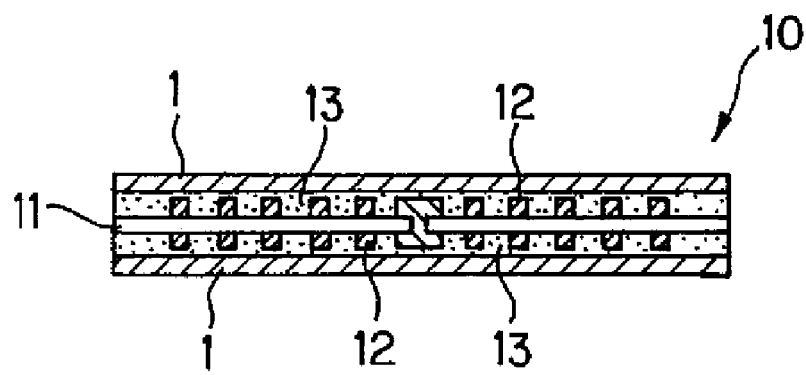
FIG. 7 is a cross-sectional view along the A-A line in FIG. 6.

An example of a planar magnetic device applied to an inductor is shown in FIGS. 6 and 7. FIG. 6 schematically shows a plan view of the inductor, and FIG. 7 schematically shows a cross-section along the A-A line in FIG. 6.

The inductor 10 shown in these figures comprises the substrate 11, planar coils 12, 12 formed in spiral shape on both surfaces of the substrate 11, insulating films 13, 13 formed so as to cover these planar coils 12, 12 and the substrate 11, and a pair of the high frequency magnetic thin films 1 of the present invention formed so as to cover the respective insulating films 13, 13. Additionally, the two above described planar coils 12, 12 are electrically connected to each other through the intermediary of a through hole 15 formed in an approximately central location on the substrate 11. Furthermore, from the planar coils 12, 12 on both surface of the substrate 11, terminals 16 for connection are extended so as to be accessible from the outside. Such an inductor 10 is constituted in such a way that a pair of the high frequency magnetic thin films 1 sandwich the planar coils 12, 12 through the intermediary of the insulating films 13, 13, so that an inductor is formed between the connection terminals 16, 16.

The inductor formed in this way is small and thin in shape and light in weight, and exhibits excellent inductance particularly in the high frequency band of 1 GHz or above.

Additionally, in the above described inductor 10, a transformer can be formed by arranging a plurality sets of the planar coils 12, 12 in a parallel manner.

Figure 8:
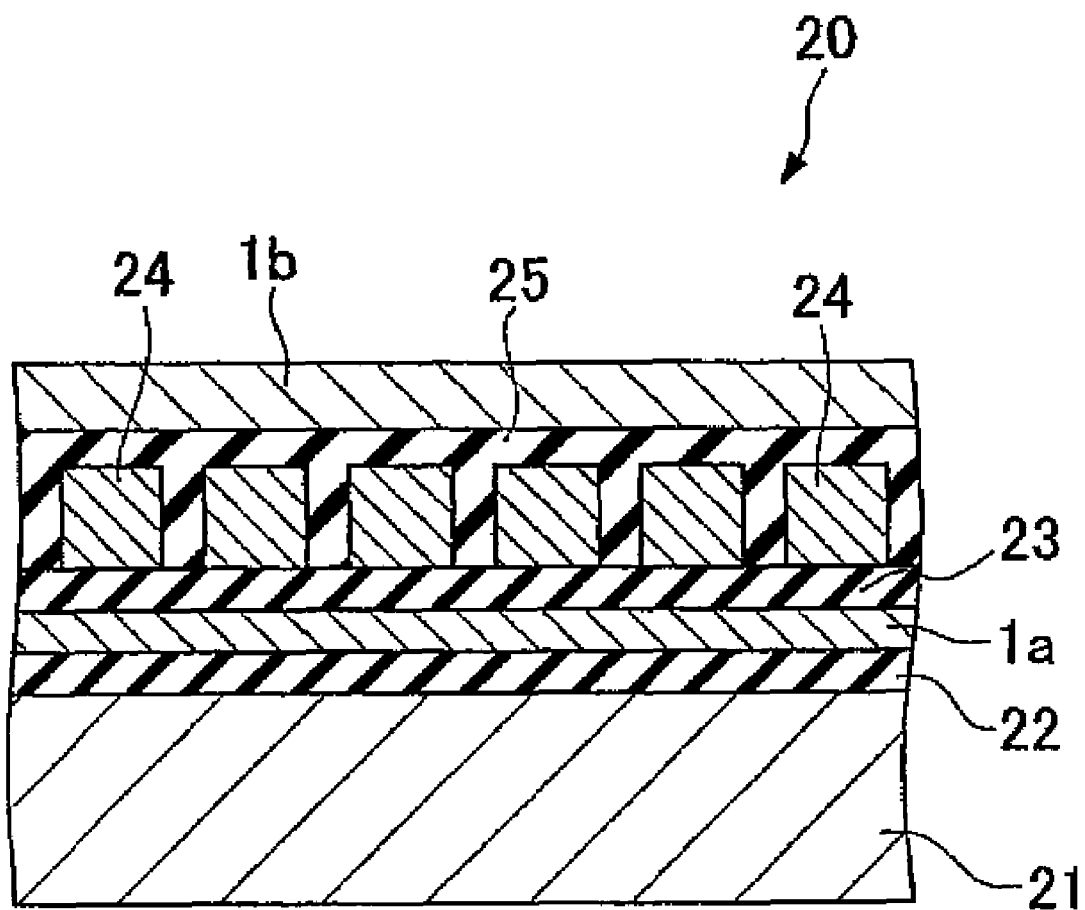
FIG. 8 is a cross-sectional view showing another example of an inductor to which a high frequency magnetic thin film of the present invention is applied.

FIG. 8 shows another preferred embodiment in which the planar magnetic device of the present invention is applied to an inductor. FIG. 8 schematically shows a cross-sectional view of the inductor. As shown in this figure, an inductor 20 comprises a substrate 21, an oxide film 22 formed according to need on the substrate 21, a high frequency magnetic thin film 1a of the present invention formed on the oxide film 22, and an insulating film 23 formed on the high frequency magnetic thin film 1a, and furthermore, has planar coils 24 formed on the insulating film 23, an insulating film 25 formed so as to cover these planar coils 24 and the insulating film 23, and a high frequency magnetic thin film 1b of the present invention formed on the insulating film 25. The inductor 20 formed in this way is also small and thin in shape and light in weight, and exhibits excellent inductance particularly in the high frequency band of 1 GHz or above. Additionally, in the inductor 20 as described above, a transformer can be formed by arranging a plurality of the planar coils 24 in a parallel manner.

In this connection, the planar magnetic devices such as the thin film inductors are demanded to provide the optimal permeability according to the design specifications for respective elements. The permeability in the high frequency band is highly correlated with the anisotropy magnetic field, and is proportional to the reciprocal of the anisotropy magnetic field. For the purpose of actualizing high permeability in the high frequency region, it is necessary that there is found the uniaxial anisotropy in the plane of the magnetic thin film. In the planar magnetic devices such as the thin film inductors, it can be expected that the higher is the saturation magnetization of a magnetic thin film, the higher is the DC superposition properties. Consequently, the magnitude of the saturation magnetization can be said to be an important parameter in the design of the high frequency magnetic thin film 1.

Figure 9:
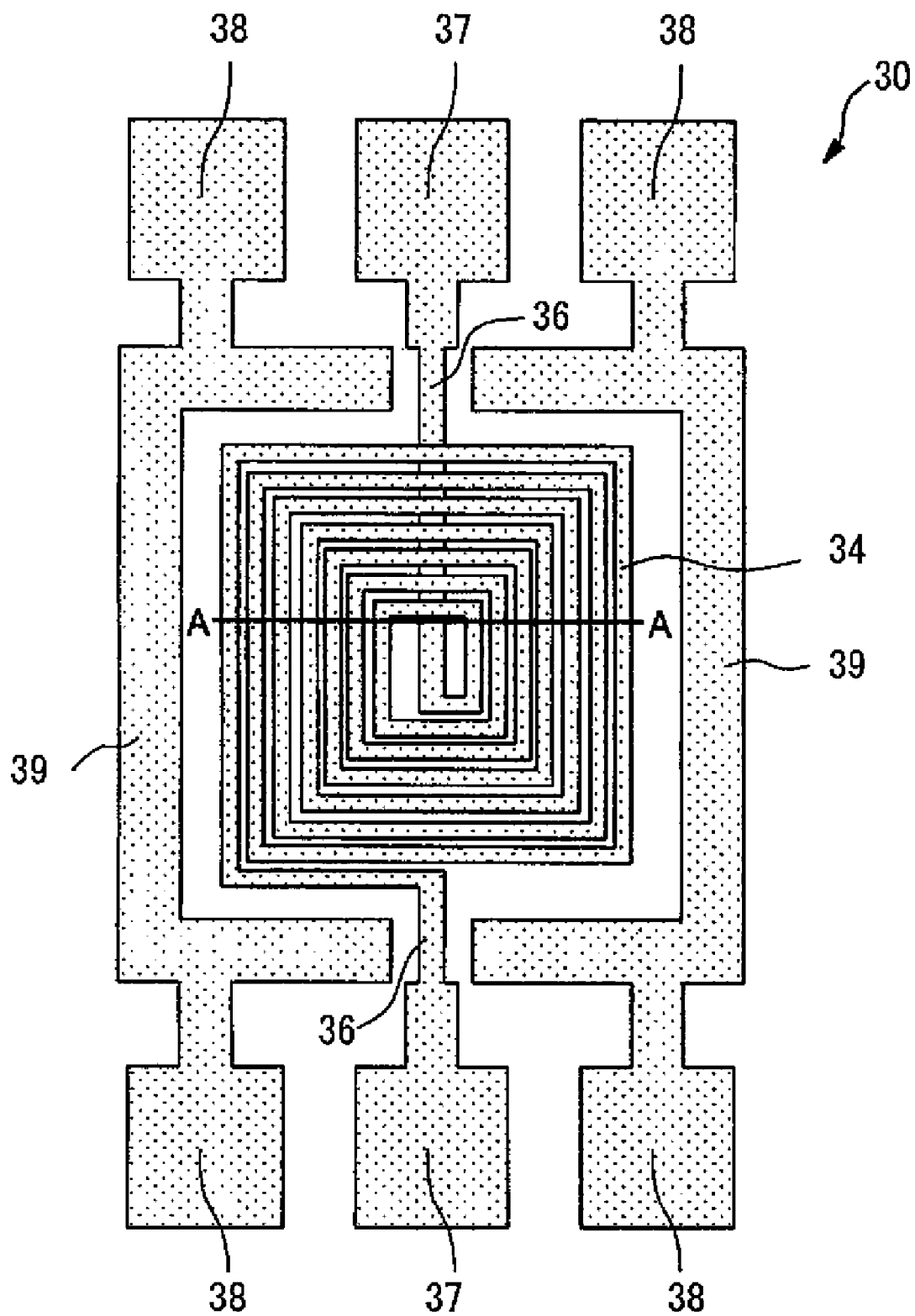
FIG. 9 is a plan view showing another example of an inductor to which a high frequency magnetic thin film of the present invention is applied.
Figure 10:
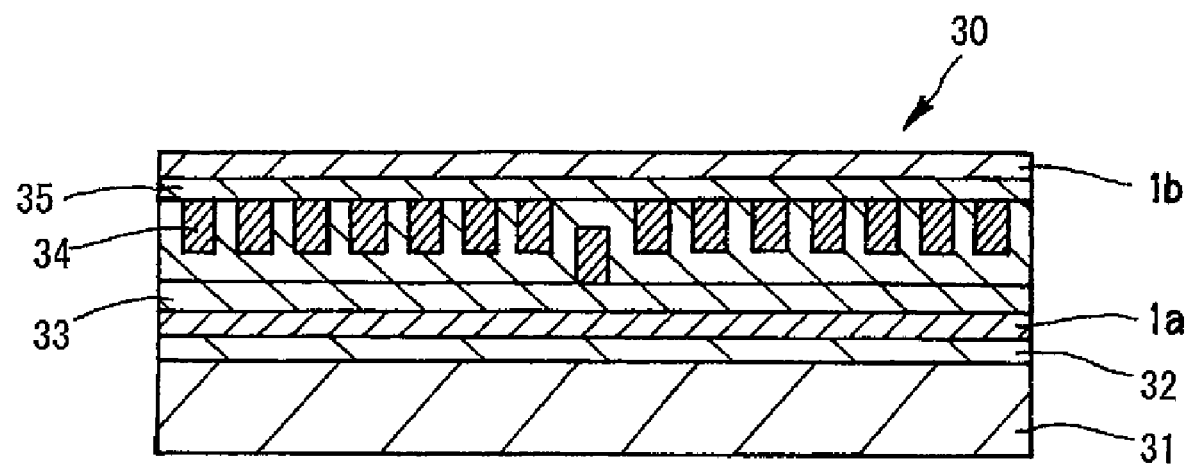
FIG. 10 is a cross-sectional view along the A-A line in FIG. 9.

FIGS. 9 and 10 show an example in which the high frequency magnetic thin film 1 of the present invention is applied as an inductor for use in an MMIC.

FIG. 9 is a schematic plan view showing the conductive layer portion extracted from the inductor, and FIG. 10 is a schematic sectional view along the A-A in FIG. 9.

An inductor 30 illustrated by these figures comprises, as FIG. 10 shows, a substrate 31, an insulating oxide film 32 formed according to need on the substrate 31, a high frequency magnetic thin film 1a of the present invention formed on the insulating oxide film 32, and an insulating film 33 formed on the high frequency magnetic thin film 1a, and furthermore, has a spiral coil 34 formed on the insulating film 33, an insulating film 35 formed so as to cover the spiral coil 34 and the insulating film 33, and a high frequency magnetic thin film 1b of the present invention formed on the insulating film 35.

Additionally, the spiral coil 34 is connected to a pair of electrodes 37 through the intermediary of the transmission lines 36 as shown in FIG. 9. A pair of ground patterns 39 arranged so as to surround the spiral coil 34 are respectively connected to a pair of ground electrodes 38, thus forming a shape in which the frequency properties are evaluated on a wafer by means of a ground-signal-ground (G-S-G) probe.

The inductor for use in an MMIC involving the shape of the present embodiment adopts a core structure in which the spiral coil 34 is sandwiched by the high frequency magnetic thin films 1a, 1b to form the core. Consequently, the inductance is improved by about 50% when compared with an inductor with air core structure in which the spiral coil 34 has the same shape but the high frequency magnetic thin films 1a, 1b are not formed. Thus, the occupation area needed for attaining the same inductance can be made smaller, and consequently the miniaturization of the spiral core 34 can be actualized.

In this connection, the material for the magnetic thin film applied to the inductors for use in an MMIC is required to have a high permeability for the high frequencies and high quality factor Q (low loss) properties in the GHz band and to permit the integration in the semiconductor fabrication process.

For the purpose of actualizing the high permeability for the high frequencies in the GHz band, materials high both in resonance frequency and saturation magnetization are advantageous, and the control of the uniaxial magnetic anisotropy is necessary. Additionally, for the purpose of attaining a high quality factor Q, the suppression of the eddy current loss caused by high resistance is important. Furthermore, for the purpose of application to the integration process, it is desirable that deposition can be performed at room temperature, and the films thus formed can be used as deposited. This is because the performances of the other on-chip components that have already undergone setting are made and the fabrication process to be free from the possible adverse effects caused by heating.

Now, further detailed description will be made below on the present invention with reference to specific examples.

EXAMPLE 1

According to the following deposition technique, a high frequency magnetic thin film of the present invention was prepared.

An Si wafer on which a 100 nm thick $SiO_2$ was deposited was used as the substrate.

The high frequency magnetic thin film was deposited on the substrate by use of a faced-targets sputtering apparatus and according to the following techniques. Preliminary evacuation of the interior of the faced-targets sputtering apparatus was carried out to $8\times10^{-5}$ Pa, thereafter Ar gas was introduced into the apparatus until the pressure reached 10 Pa, and then the substrate surface was subjected to sputter etching at an RF power of 100 W for 10 minutes.

Subsequently, the Ar gas flow rate was adjusted so as for the pressure to be 0.4 Pa, at a power of 300 W, a $Co_{87}Zr_5Nb_8$ target and a composite target composed of an Fe target and C (carbon) pellets arranged thereon were alternately and repeatedly subjected to sputtering, and thus a composite magnetic thin film was deposited as the high frequency magnetic thin film formed according to the specifications to be described later.

At the time of deposition, a DC bias of −40 to −80 V was applied to the substrate. For the purpose of preventing the effects of impurities on the surfaces of the targets, the sputtering was conducted for 10 minutes or more with a shutter in a closed condition. Thereafter, with the shutter opened, the deposition onto the substrate was carried out. The deposition rates were 0.33 nm/sec for the CoZrNb layer deposition and 0.27 nm/sec for the Fe—C layer deposition. By controlling the opening and closing times of the shutter, the film thickness of the respective layers, being alternately laminated, were regulated. After a CoZrNb layer was deposited as the first layer on the substrate, a Fe—C layer was formed thereon, and then successively the CoZrNb layer and the Fe—C layer were laminated in an alternate manner.

On the basis of the deposition method described above, the 20 nm thick CoZrNb layer and the 5 nm thick Fe—C layer (carbon concentration: 5 at %) were alternately laminated 20 times for each layer in a successive manner, and thus a composite magnetic thin film (Example 1) of the present invention, having a total film thickness of 500 nm (40 layers in total) was formed.

Examination of the structure of the composite magnetic thin film confirmed that the Fe—C layers were composed of the above described amorphous structure portion and the columnar structure portion formed thereon, and the aspect ratio of the columnar structure portion was 1.4 or less. Additionally, the CoZrNb layers were confirmed to be amorphous.

Figure 11:
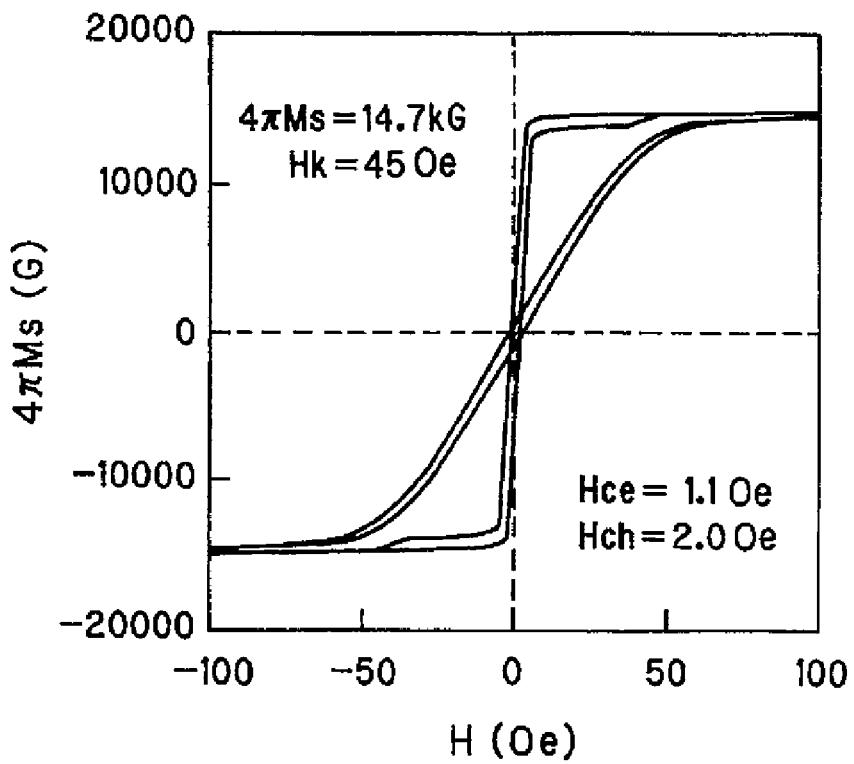
FIG. 11 is a graph showing the magnetization curve of a composite magnetic thin film prepared in Example 1.

FIG. 11 shows the magnetization curve measured after deposition. As is clear from the magnetization curve shown in FIG. 11, the in-plane uniaxial magnetic anisotropy was observed in the laminated film, and a value of 14.7 kG (1.47 T) was obtained for the saturation magnetization, a value of 45 Oe (3580.99 A/M) was obtained for the anisotropy field, and a value of 1.1 Oe (87.53 A/m) was obtained for the easy axis coercivity.

Figure 12:
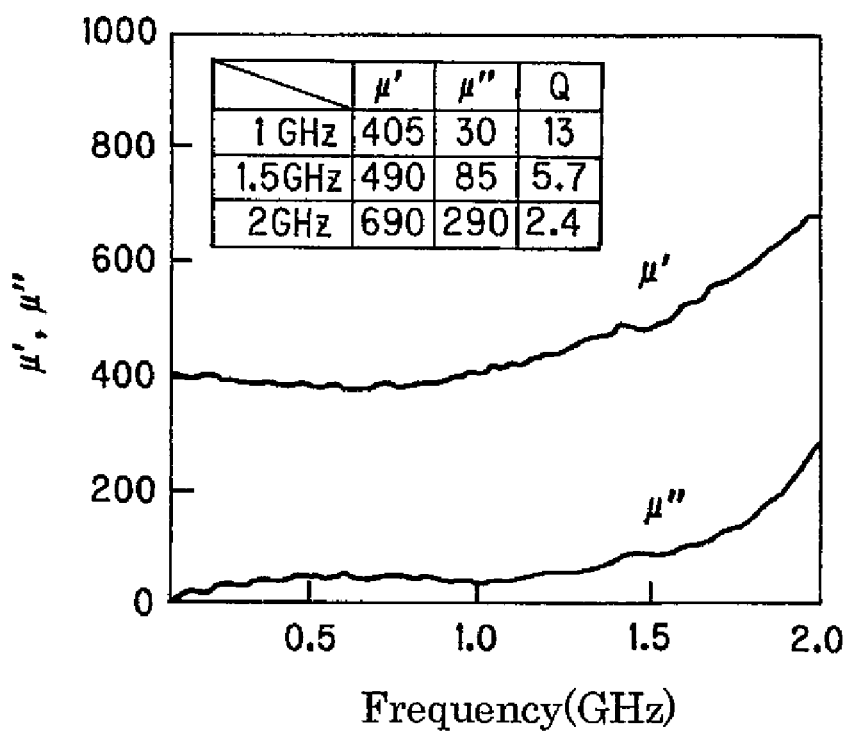
FIG. 12 is a graph showing the high frequency permeability properties of the composite magnetic thin film prepared in Example 1.

Additionally, FIG. 12 shows the high frequency permeability properties of the composite magnetic thin film. As shown in the graph of FIG. 12, the resonance frequency exceeds the measurement limit of 2 GHz, and the real part ($\mu'$) of the permeability in the GHz region is 400 or more. Additionally, for the quality factor Q ($Q=\mu'/\mu''$), a value of 13 was obtained at 1 GHz and a value of 2 or more was obtained at 2 GHz. The high frequency permeability measurement was made by use of a thin film high frequency permeability measurement apparatus (Naruse Kagakukiki Co., RHF-F1000), and the magnetic properties were measured by use of a vibrating sample magnetometer (Riken Denshi Co., Ltd., BHV-35).

EXAMPLE 2

On the basis of the above described deposition technique of Example 1, a 20 nm thick CoZrNb layer and a 20 nm Fe—C layer (carbon concentration: 5 at %) were alternately laminated each in 13 layers in a successive manner, and thus a composite magnetic thin film (Example 2) of the present invention having a total film thickness of 520 nm (26 layers in total) was formed.

Examination of the structure of the composite magnetic thin film confirmed that the Fe—C layers were mainly constituted with columnar grains and the aspect ratio of the columnar structure portion was 1.4 or less. Additionally, the CoZrNb layers were confirmed to be amorphous.

Figure 13:
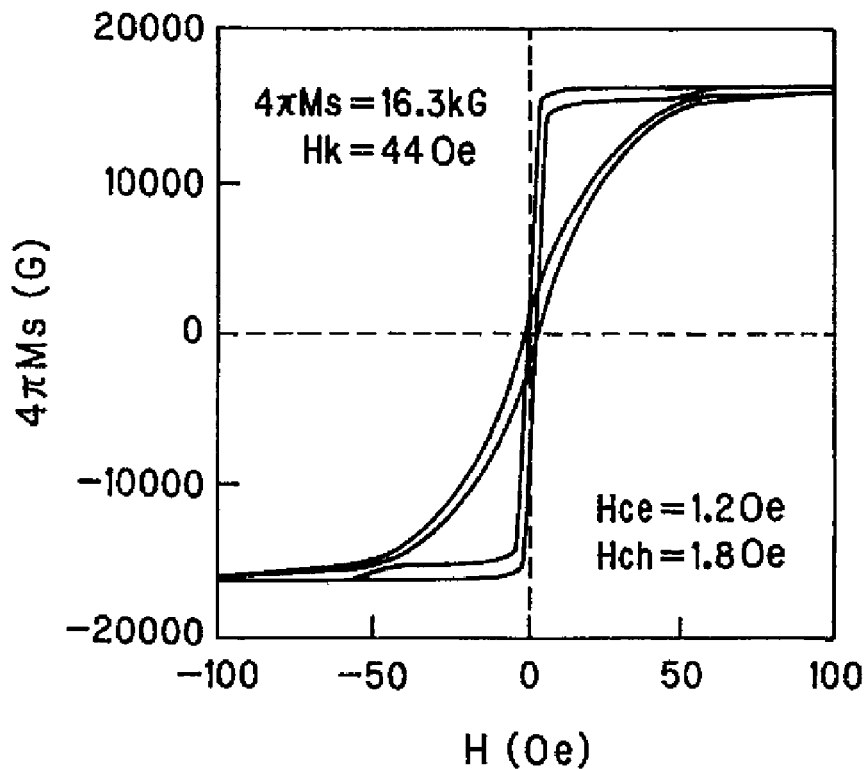
FIG. 13 is a graph showing the magnetization curve of a composite magnetic thin film prepared in Example 2.

FIG. 13 shows the magnetization curve measured after deposition. As is clear from the magnetization curve shown in FIG. 13, the in-plane uniaxial magnetic anisotropy was observed in the laminated film, and a value of 16.3 kG (1.63 T) was obtained for the saturation magnetization, a value of 44 Oe (3501.41 A/m) was obtained for the anisotropy field, and a value of 1.2 Oe (95.49 A/m) was obtained for the easy axis coercivity.

Figure 14:
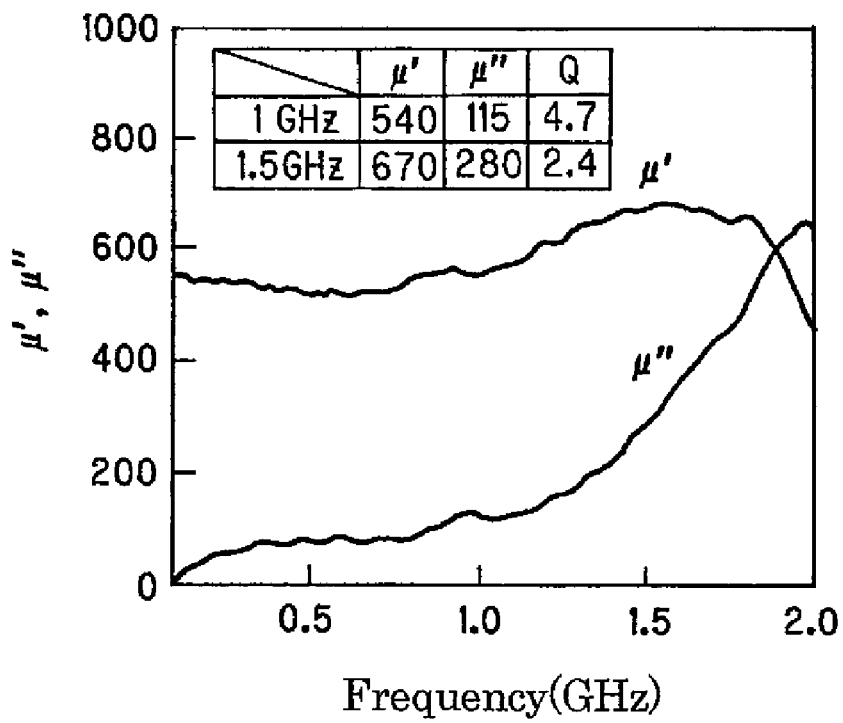
FIG. 14 is a graph showing the high frequency permeability properties of the composite magnetic thin film prepared in Example 2.

Additionally, FIG. 14 shows the high frequency permeability properties of the composite magnetic thin film. As shown in the graph of FIG. 14, for the real part ($\mu'$) of the permeability, a value of 540 was obtained at 1 GHz and a value of 670 was obtained at 1.5 GHz. Additionally, for the quality factor Q ($Q=\mu'/\mu''$), a value of 4.7 was obtained at 1 GHz and a value of 2 or more was obtained at 1.5 GHz.

EXAMPLE 3

On the basis of the above described deposition technique of Example 1, a 20 nm thick CoZrNb layer and a 50 nm Fe—C layer (carbon concentration: 5 at %) were alternately laminated each in 7 layers in a successive manner, and thus a composite magnetic thin film (Example 3) of the present invention having a total film thickness of 490 nm (14 layers in total) was formed.

Examination of the structure of the composite magnetic thin film confirmed that the Fe—C layers were mainly constituted with columnar grains and the aspect ratio of the columnar structure portion was 1.4 or less. Additionally, the CoZrNb layers were confirmed to be amorphous.

Figure 15:
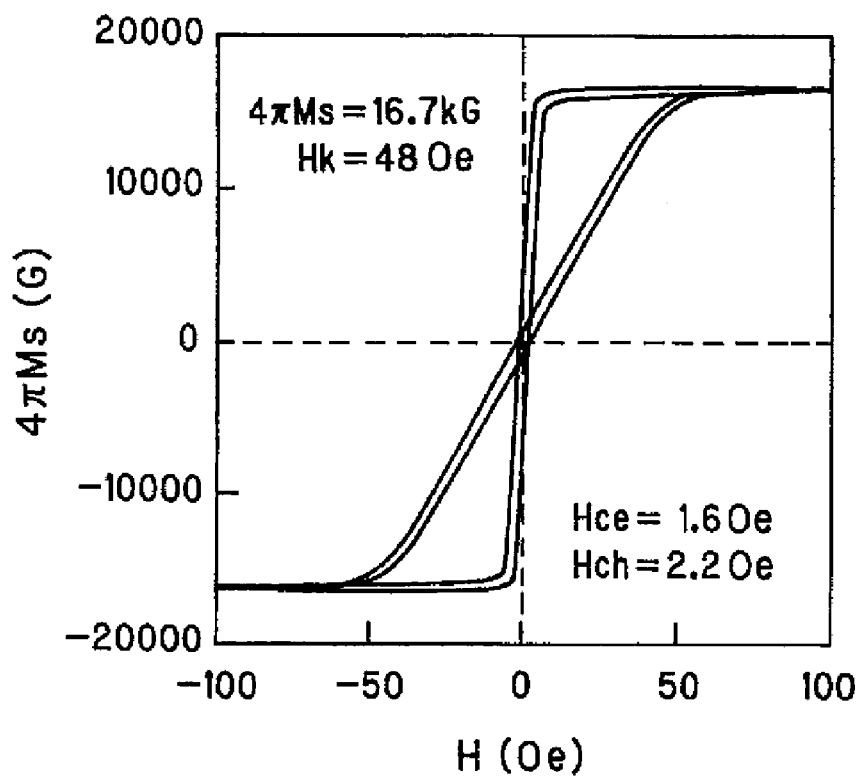
FIG. 15 is a graph showing the magnetization curve of a composite magnetic thin film prepared in Example 3.

FIG. 15 shows the magnetization curve measured after deposition. As is clear from the magnetization curve shown in FIG. 15, the in-plane uniaxial magnetic anisotropy was observed in the laminated film, and a value of 16.7 kG (1.67 T) was obtained for the saturation magnetization, a value of 48 Oe (3819.72 A/m) was obtained for the anisotropy field, and a value of 1.60 Oe (127.32 A/m) was obtained for the easy axis coercivity.

Figure 16:
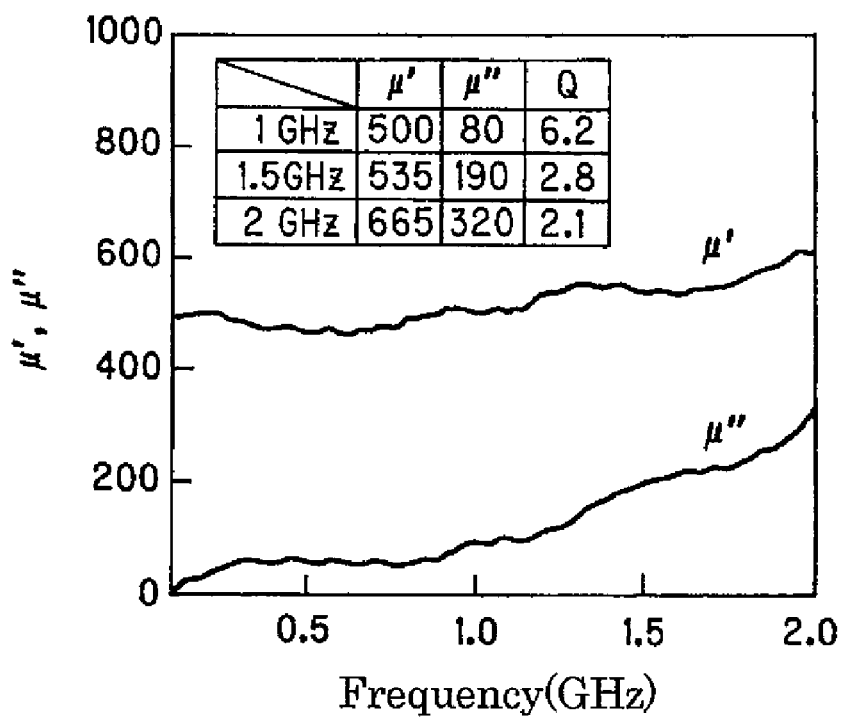
FIG. 16 is a graph showing the high frequency permeability properties of the composite magnetic thin film prepared in Example 3.

Additionally, FIG. 16 shows the high frequency permeability properties of the composite magnetic thin film. As shown in the graph of FIG. 16, the real part ($\mu'$) of the permeability is 500 or more in the GHz region. Additionally, for the quality factor Q ($Q=\mu'/\mu''$), a value of 6 or more was obtained at 1 GHz and a value of 2 or more was obtained at 2 GHz.

EXAMPLE 4

On the basis of the above described deposition technique of Example 1, a 20 nm thick CoZrNb layer and a 2 nm Fe—C layer (carbon concentration: 5 at %) were alternately laminated each in 20 layers in a successive manner, and thus a composite magnetic thin film (Example 4) of the present invention having a total film thickness of 440 nm (40 layers in total) was formed.

Examination of the structure of the composite magnetic thin film confirmed that the Fe—C layers and the CoZrNb layers were both amorphous.

On the basis of the methods in conformity with the above described examples, the physical property values of the composite magnetic thin film were measured, and thus a saturation magnetization of 12.5 kG (1.25 T), an anisotropy field of 20 Oe (1591.55 A/m), and an easy axis coercivity of 1.10 Oe (87.53 A/m) were obtained.

Additionally, a value of 900 for the real part ($\mu'$) of the permeability at 1 GHz and a value of 1.3 for the quality factor Q ($Q=\mu'/\mu''$) at 1 GHz were obtained.

EXAMPLE 5

On the basis of the above described deposition technique of Example 1, a 20 nm thick CoZrNb layer and a 80 nm Fe—C layer (carbon concentration: 5 at %) were alternately laminated each in 7 layers in a successive manner, and thus a composite magnetic thin film (Example 5) of the present invention having a total film thickness of 700 nm (14 layers in total) was formed.

Figure 17:
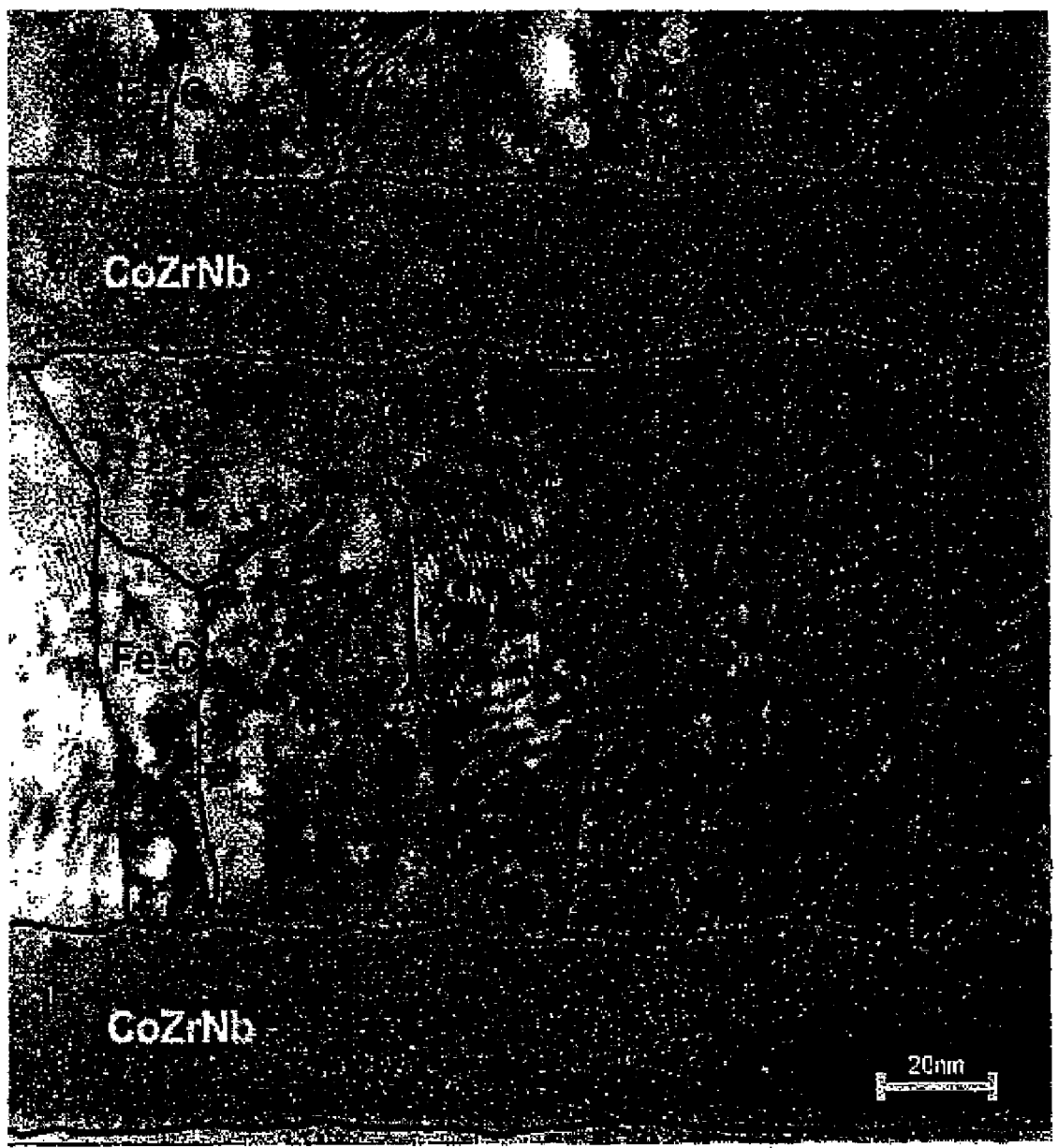
FIG. 17 is a cross-sectional image, obtained by means of a transmission electron microscope, of a composite magnetic thin film prepared in Example 5.

FIG. 17 shows a sectional view of the composite magnetic thin film, obtained by means of a transmission electron microscope; it was confirmed that the Fe—C layers were mainly constituted with columnar grains and the aspect ratio of the columnar structure portion was 1.4 or less.

On the basis of the methods in conformity with the above described examples, the physical property values of the composite magnetic thin film concerned were measured, and thus a saturation magnetization of 18.0 kG (1.80 T), an anisotropy field of 92 Oe (7321.13 A/m), and an easy axis coercivity of 2.8 Oe (222.82 A/m) were obtained.

Additionally, a value of 200 for the real part ($\mu'$) of the permeability at 1 GHz and a value of 8 for the quality factor Q ($Q=\mu'/\mu''$) at 1 GHz were obtained.

EXAMPLE 6

A composite magnetic thin film (Example 6) of the present invention was formed in the same manner as that in Example 1 except that the carbon concentration in the Fe—C layer was altered from 5 at % to 7 at %.

On the basis of the methods in conformity with the above described examples, the physical property values of the composite magnetic thin film concerned were measured, and thus a saturation magnetization of 14.7 kG (1.47 T), an anisotropy field of 42 Oe (3342.25 A/m), and an easy axis coercivity of 1.0 Oe (79.58 A/m) were obtained.

Additionally, a value of 410 for the real part ($\mu'$) of the permeability at 1 GHz and a value of 14 for the quality factor Q ($Q=\mu'/\mu''$) at 1 GHz were obtained.

EXAMPLE 7

A composite magnetic thin film (Example 7) of the present invention was formed in the same manner as that in Example 1 except that the carbon concentration in the Fe—C layer was altered from 5 at % to 10 at %.

On the basis of the methods in conformity with the above described examples, the physical property values of the composite magnetic thin film concerned were measured, and thus a saturation magnetization of 14.5 kG (1.45 T), an anisotropy field of 40 Oe (3183.10 A/m), and an easy axis coercivity of 1.0 Oe (79.58 A/m) were obtained.

Additionally, a value of 490 for the real part ($\mu'$) of the permeability at 1 GHz and a value of 11 for the quality factor Q ($Q=\mu'/\mu''$) at 1 GHz were obtained.

COMPARATIVE EXAMPLE 1

A composite magnetic thin film (Comparative Example 1) of the comparative example was formed in the same manner as that in Example 1 except that the Fe—C layers was replaced with the Fe layers.

On the basis of the methods in conformity with the above described examples, the physical property values of the composite magnetic thin film concerned were measured, and thus a saturation magnetization of 17.6 kG (1.76 T), an anisotropy field of 28 Oe (2228.24 A/m), and an easy axis coercivity of 18.0 Oe (1432.44 A/m) were obtained.

Additionally, a value of 120 for the real part ($\mu'$) of the permeability at 1 GHz and a value of 4 for the quality factor Q ($Q=\mu'/\mu''$) at 1 GHz were obtained.

EXAMPLE 8

A composite magnetic thin film (Example 8) of the present invention was formed in the same manner as that in Example 1 except that the composition of the Co-based amorphous alloy layer was altered from $Co_{87}Zr_5Nb_8$ to $Co_{89}Zr_6Ta_5$.

On the basis of the methods in conformity with the above described examples, the physical property values of the composite magnetic thin film concerned were measured, and thus a saturation magnetization of 14.9 kG (1.49 T), an anisotropy field of 44 Oe (3501.44 A/m), and an easy axis coercivity of 1.1 Oe (87.53 A/m) were obtained.

Additionally, a value of 455 for the real part ($\mu'$) of the permeability at 1 GHz and a value of 11 for the quality factor Q ($Q=\mu'/\mu''$) at 1 GHz were obtained.

EXAMPLE 9

A composite magnetic thin film (Example 9) of the present invention was formed in the same manner as that in Example 1 except that the composition of the Co-based amorphous alloy layer was altered from $Co_{87}Zr_5Nb_8$ to $Co_{80}Fe_9Zr_3B_8$.

On the basis of the methods in conformity with the above described examples, the physical property values of the composite magnetic thin film concerned were measured, and thus a saturation magnetization of 14.7 kG (1.47 T), an anisotropy field of 48 Oe (3919.72 A/m), and an easy axis coercivity of 1.2 Oe (95.49 A/m) were obtained.

Additionally, a value of 410 for the real part ($\mu'$) of the permeability at 1 GHz and a value of 12 for the quality factor Q ($Q=\mu'/\mu''$) at 1 GHz were obtained.

COMPARATIVE EXAMPLE 2

A composite magnetic thin film (Comparative Example 2) of the comparative example was formed in the same manner as that in Example 1 except that the 500 nm thick composite magnetic thin film was replaced with a 500 nm thick single layer film made of $Co_{87}Zr_5Nb_8$.

On the basis of the methods in conformity with the above described examples, the physical property values of the composite magnetic thin film concerned were measured, and thus a saturation magnetization of 11.5 kG (1.15 T), an anisotropy field of 15 Oe (1193.66 A/m), and an easy axis coercivity of 0.8 Oe (63.66 A/m) were obtained.

Additionally, a value of 1091 for the real part ($\mu'$) of the permeability at 1 GHz and a value of 1 for the quality factor Q ($Q=\mu'/\mu''$) at 1 GHz were obtained.

COMPARATIVE EXAMPLE 3

A composite magnetic thin film (Comparative Example 3) of the comparative example was formed in the same manner as that in Example 1 except that the 500 nm thick composite magnetic thin film was replaced with a 1,000 nm thick single layer film made of $Co_{89}Zr_6Ta_5$.

On the basis of the methods in conformity with the above described examples, the physical property values of the composite magnetic thin film concerned were measured, and thus a saturation magnetization of 13.0 kG (1.30 T), an anisotropy field of 16 Oe (1273.24 A/m), and an easy axis coercivity of 0.9 Oe (71.62 A/m) were obtained.

Additionally, a value of 325 for the real part ($\mu'$) of the permeability at 1 GHz and a value of 0.5 for the quality factor Q ($Q=\mu'/\mu''$) at 1 GHz were obtained.

COMPARATIVE EXAMPLE 4

A composite magnetic thin film (Comparative Example 4) of the comparative example was formed in the same manner as that in Example 1 except that the 500 nm thick composite magnetic thin film was replaced with a 1,000 nm thick single layer film made of $Co_{79}Fe_9Zr_2Ta_{10}$.

On the basis of the methods in conformity with the above described examples, the physical property values of the composite magnetic thin film concerned were measured, and thus a saturation magnetization of 11.0 kG (1.10 T), an anisotropy field of 36 Oe (2864.79 A/m), and an easy axis coercivity of 1.1 Oe (87.53 A/m) were obtained.

Additionally, a value of 327 for the real part ($\mu'$) of the permeability at 1 GHz and a value of 1.7 for the quality factor Q ($Q=\mu'/\mu''$) at 1 GHz were obtained.

FIG. 24 collects the magnetic properties and the like of the magnetic thin films prepared in Examples 1 to 9 and Comparative Examples 1 to 4.

As shown in FIG. 24, the respective examples according to the present invention can attain a saturation magnetization of 1.2 T or more, a resonance frequency of 1.5 GHz or more, and a Q value of 1.0 or more. Among these examples, Examples 1 to 3, 6, 7, 8 and 9 in which T1 falls within the range from 3 to 70 nm and T1/T2 falls within the range from 0.15 to 3.50 can attain a saturation magnetization of 1.4 T or more, a resonance frequency of 2.0 GHz or more, and a Q value of 4.0 or more.

EXAMPLE 10

On the basis of the same manner as that in Example 1 except that an Si wafer on which $SiO_2$ was deposited in a thickness of 500 nm was used as the substrate, the 1.0 nm thick CoZrNb layer and the 1.0 nm thick Fe—C layer (carbon concentration: 5 at %) were alternately laminated 250 times for each layer in a successive manner, and thus the composite magnetic thin film (Example 10) of the present invention, having a total film thickness of 500 nm (500 layers in total) was formed. Incidentally, the substrate temperature was not controlled during deposition, and thus the substrate temperature had been increased to 30° C. by the time when deposition was made until the total film thickness reached a value of 500 nm.

Examination of the structure of the composite magnetic thin film confirmed that the Fe—C layers and the CoZrNb layers were both amorphous.

Figure 18:
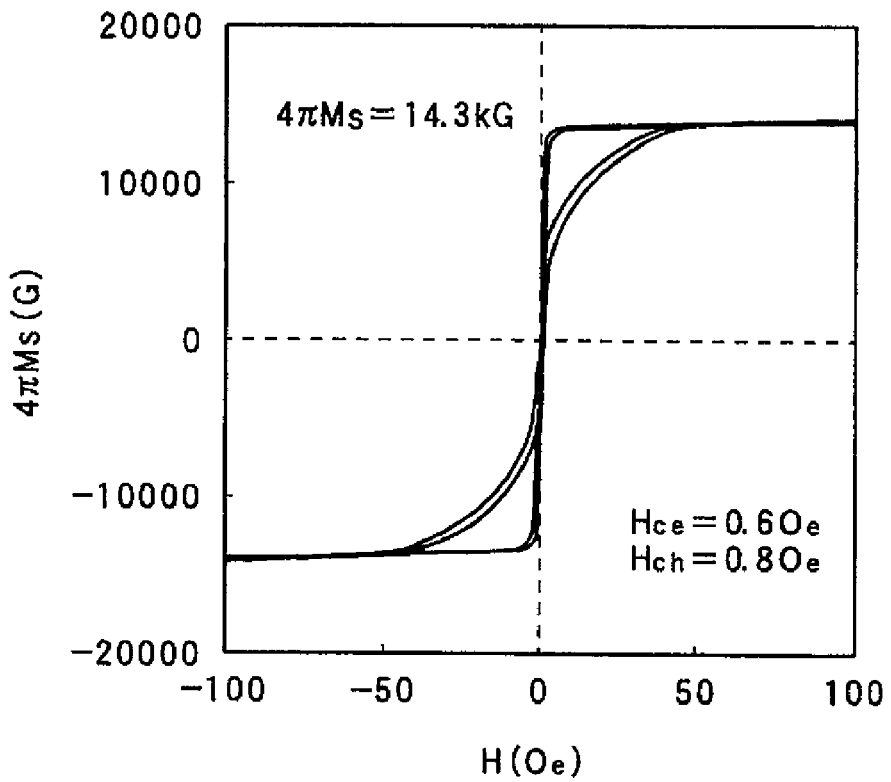
FIG. 18 is a graph showing the magnetization curve of a composite magnetic thin film prepared in Example 10.
Figure 19:
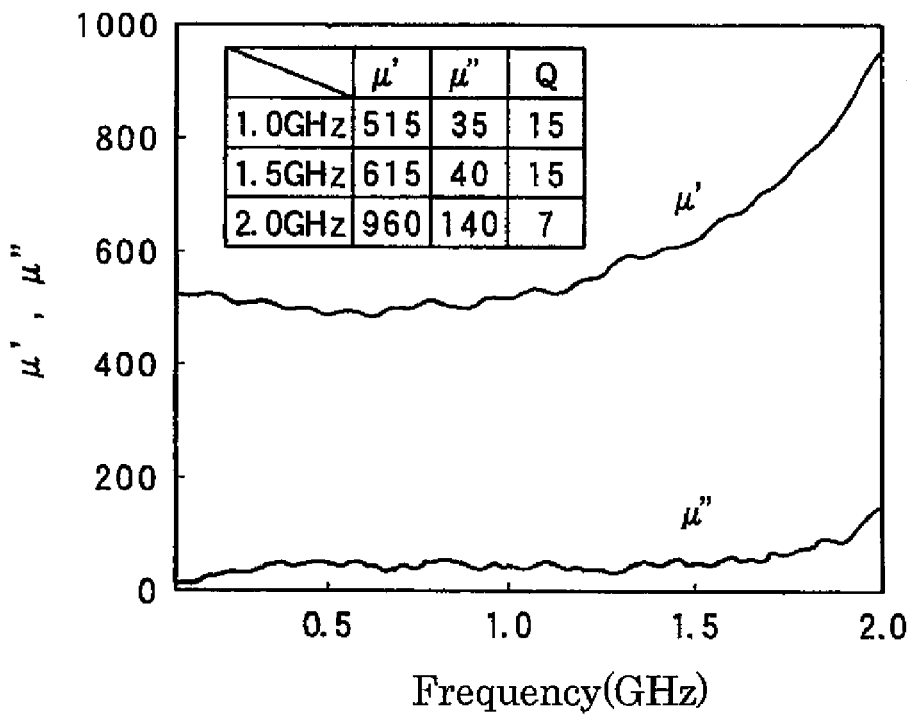
FIG. 19 is a graph showing the high frequency permeability properties of the composite magnetic thin film prepared in Example 10.

FIG. 18 shows the magnetization curve measured after deposition. As is clear from the magnetization curve shown in FIG. 18, the in-plane uniaxial magnetic anisotropy was observed in the laminated film, and a value of 14.3 kG (1.43 T) was obtained for the saturation magnetization, a value of 0.6 Oe (47.75 A/m) was obtained for the easy axis coercivity, and a value of 0.8 Oe (63.66 A/m) was obtained for the hard axis coercivity. Additionally, FIG. 19 shows the high frequency permeability properties of the laminate film of the present example. As shown in the graph of FIG. 19, the resonance frequency exceeds the measurement limit of 2 GHz, and the real part ($\mu'$) of the permeability in the GHz region is 500 or more. Additionally, for the quality factor Q ($Q=\mu'/\mu''$), a value of 15 was obtained at 1 GHz and a value of 7 was obtained at 2 GHz.

EXAMPLE 11

On the basis of the above described deposition technique of Example 10, the 1.5 nm thick CoZrNb layer and the 1.5 nm thick Fe—C layer (carbon concentration: 5 at %) were alternately laminated each in 170 layers in a successive manner, and thus the composite magnetic thin film (Example 11) of the present invention, having a total film thickness of 510 nm (340 layers in total) was formed.

Examination of the structure of the composite magnetic thin film confirmed that the Fe—C layers and the CoZrNb layers were both amorphous.

Figure 20:
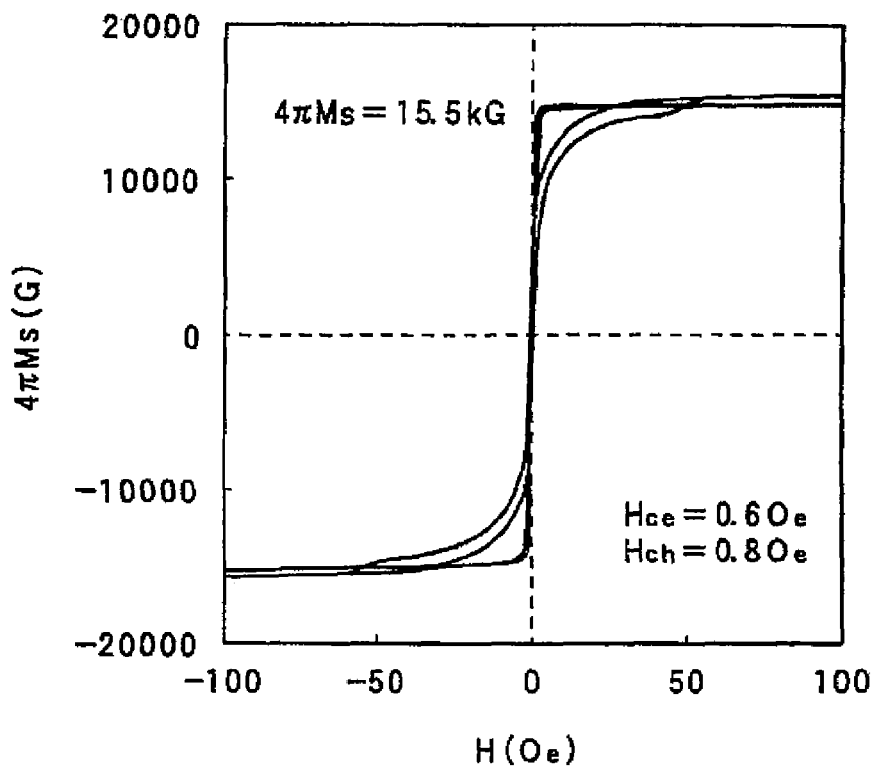
FIG. 20 is a graph showing the magnetization curve of a composite magnetic thin film prepared in Example 11.
Figure 21:
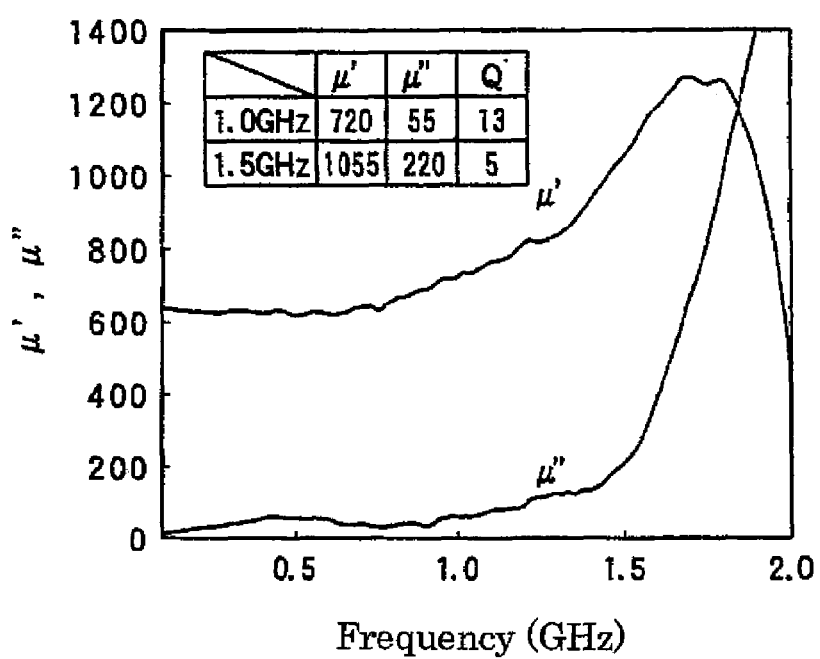
FIG. 21 is a graph showing the high frequency permeability properties of the composite magnetic thin film prepared in Example 11.

FIG. 20 shows the magnetization curve measured after deposition. As the magnetic properties obtained from the magnetization curve shown in FIG. 20, the saturation magnetization was 15.5 kG (1.55 T), the easy axis coercivity was 0.6 Oe (47.75 A/m), and the hard axis coercivity was 0.8 Oe (63.66 A/m). FIG. 21 shows the high frequency permeability properties of the laminate film of the present example. As shown in the graph of FIG. 21, for the real part ($\mu'$) of the permeability, a value of 720 was obtained at 1 GHz and a value of 1055 was obtained at 1.5 GHz. Additionally, for the quality factor Q ($Q=\mu'/\mu''$) a value of 13 was obtained at 1.0 GHz and a value of 5 was obtained at 1.5 GHz.

EXAMPLE 12

On the basis of the above described deposition technique of Example 10, the 1.0 nm thick CoZrNb layer and the 2.0 nm thick Fe—C layer (carbon concentration: 5 at %) were alternately laminated each in 170 layers in a successive manner, and thus the composite magnetic thin film (Example 12) of the present invention, having a total film thickness of 510 nm (340 layers in total) was formed.

Examination of the structure of the composite magnetic thin film confirmed that the Fe—C layers and the CoZrNb layers were both amorphous.

Figure 22:
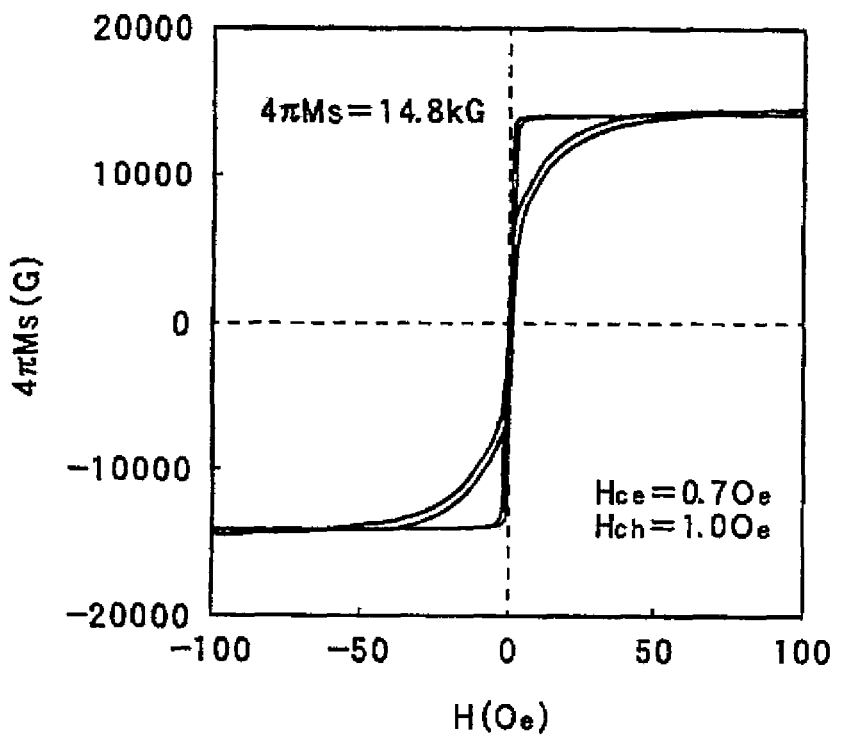
FIG. 22 is a graph showing the magnetization curve of a composite magnetic thin film prepared in Example 12.

FIG. 22 shows the magnetization curve measured after deposition. As the magnetic properties obtained from the magnetization curve shown in FIG. 22, the saturation magnetization was 14.8 kG (1.48 T), the easy axis coercivity was 0.7 Oe (55.70 A/m), and the hard axis coercivity was 1.0 Oe (79.58 A/m).

Figure 23:
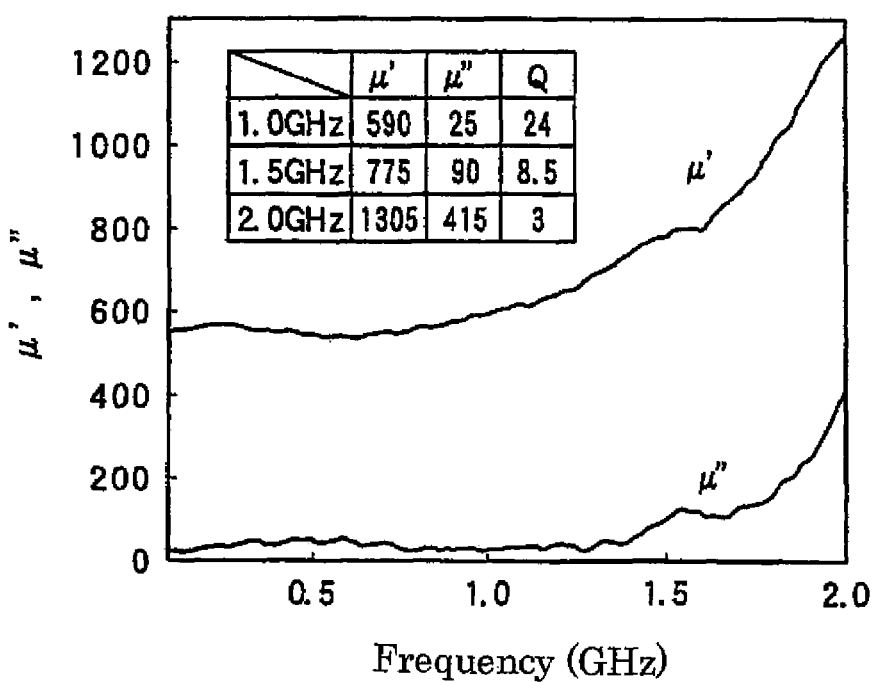
FIG. 23 is a graph showing the high frequency permeability properties of the composite magnetic thin film prepared in Example 12.

FIG. 23 shows the high frequency permeability properties of the laminate film of the present example. As shown in the graph of FIG. 23, the resonance frequency exceeds the measurement limit of 2 GHz, and the real part ($\mu'$) of the permeability is 500 or more in the GHz region. Additionally, for the quality factor Q ($Q=\mu'/\mu''$), a value of 8.5 was obtained at 1.5 GHz and a value of 3 was obtained at 2 GHz.

EXAMPLE 13

On the basis of the above described deposition technique of Example 10, the 1.0 nm thick CoZrNb layer and the 2.8 nm thick Fe—C layer (carbon concentration: 5 at %) were alternately laminated each in 135 layers in a successive manner, and thus the composite magnetic thin film (Example 13) of the present invention, having a total film thickness of 513 nm (270 layers in total) was formed.

Examination of the structure of the composite magnetic thin film confirmed that the Fe—C layers and the CoZrNb layers were both amorphous.

On the basis of the methods in conformity with the above described examples, the physical property values of the composite magnetic thin film concerned were measured, and thus a saturation magnetization of 15.0 kG (1.50 T), an easy axis coercivity of 0.8 Oe (63.66 A/m), and a hard axis coercivity of 0.9 Oe (71.62 A/m) were obtained.

Additionally, a value of 550 was obtained at 1 GHz for the real part ($\mu'$) of the permeability, and a value of 22 was obtained at 1 GHz for the quality factor Q ($Q=\mu'/\mu''$).

EXAMPLE 14

On the basis of the above described deposition technique of Example 1, the 0.8 nm thick CoZrNb layer and the 2.8 nm thick Fe—C layer (carbon concentration: 5 at %) were alternately laminated each in 140 layers in a successive manner, and thus the composite magnetic thin film (Example 14) of the present invention, having a total film thickness of 504 nm (280 layers in total) was formed.

Examination of the structure of the composite magnetic thin film confirmed that the Fe—C layers and the CoZrNb layers were both amorphous.

On the basis of the methods in conformity with the above described examples, the physical property values of the composite magnetic thin film concerned were measured, and thus a saturation magnetization of 15.8 kG (1.58 T), an easy axis coercivity of 0.9 Oe (71.62 A/m), and a hard axis coercivity of 1.1 Oe (87.54 A/m) were obtained.

Additionally, a value of 400 was obtained at 1 GHz for the real part ($\mu'$) of the permeability, and a value of 16 was obtained at 1 GHz for the quality factor Q ($Q=\mu'/\mu''$).

EXAMPLE 15

On the basis of the above described deposition technique of Example 1, the 2.0 nm thick CoZrNb layer and the 1.0 nm thick Fe—C layer (carbon concentration: 5 at %) were alternately laminated each in 170 layers in a successive manner, and thus the composite magnetic thin film (Example 15) of the present invention, having a total film thickness of 510 nm (340 layers in total) was formed.

Examination of the structure of the composite magnetic thin film confirmed that the Fe—C layers and the CoZrNb layers were both amorphous.

On the basis of the methods in conformity with the above described examples, the physical property values of the composite magnetic thin film concerned were measured, and thus a saturation magnetization of 13.9 kG (1.39 T), an easy axis coercivity of 0.6 Oe (47.75 A/m), and a hard axis coercivity of 0.7 Oe (55.70 A/m) were obtained.

Additionally, a value of 755 was obtained at 1 GHz for the real part ($\mu'$) of the permeability, and a value of 6 was obtained at 1 GHz for the quality factor Q ($Q=\mu'/\mu''$).

COMPARATIVE EXAMPLE 5

On the basis of the same manner as that in Example 10 except that the Fe—C layers were replaced with the Fe layers, the composite magnetic thin film (Comparative Example 5) of the comparative example was formed.

On the basis of the methods in conformity with the above described examples, the physical property values of the composite magnetic thin film concerned were measured, and thus a saturation magnetization of 20.7 kG (2.07 T), an easy axis coercivity of 4.2 Oe (334.23 A/m), and a hard axis coercivity of 19.0 Oe (1511.97 A/m) were obtained.

Additionally, a value of 150 was obtained at 1 GHz for the real part ($\mu'$) of the permeability, but the permeability was so low that the observed value of $\mu''$ was not reliable, and hence the quality factor Q ($Q=\mu'/\mu''$) was not able to be obtained.

EXAMPLE 16

On the basis of the same manner as that in Example 10 except that the carbon concentration of the Fe—C layer was altered from 5 at % to 7 at %, a composite magnetic thin film (Example 16) of the present invention was formed.

On the basis of the methods in conformity with the above described examples, the physical property values of the composite magnetic thin film concerned were measured, and thus a saturation magnetization of 14.1 kG (1.41 T), an easy axis coercivity of 0.6 Oe (47.75 A/m), and a hard axis coercivity of 0.7 Oe (55.76 A/m) were obtained.

Additionally, a value of 600 was obtained at 1 GHz for the real part ($\mu'$) of the permeability, and a value of 12 was obtained at 1 GHz for the quality factor Q ($Q=\mu'/\mu''$).

EXAMPLE 17

On the basis of the same manner as that in Example 10 except that the carbon concentration of the Fe—C layer was altered from 5 at % to 10 at %, a composite magnetic thin film (Example 17) of the present invention was formed.

On the basis of the methods in conformity with the above described examples, the physical property values of the composite magnetic thin film concerned were measured, and thus a saturation magnetization of 14.0 kG (1.40 T), an easy axis coercivity of 0.6 Oe (47.75 A/m), and a hard axis coercivity of 0.7 Oe (55.76 A/m) were obtained.

Additionally, a value of 750 was obtained at 1 GHz for the real part (μ') of the permeability, and a value of 12 was obtained at 1 GHz for the quality factor Q (Q=μ'/μ").

EXAMPLE 18

On the basis of the same manner as that in Example 10 except that the composition of the Co-based amorphous alloy layer was altered from $Co_{87}Zr_5Nb_8$ to $Co_{89}Zr_6Ta_5$, a composite magnetic thin film (Example 18) of the present invention was formed.

On the basis of the methods in conformity with the above described examples, the physical property values of the composite magnetic thin film concerned were measured, and thus a saturation magnetization of 14.4 kG (1.44 T), an easy axis coercivity of 0.6 Oe (47.75 A/m), and a hard axis coercivity of 0.7 Oe (55.76 A/m) were obtained.

Additionally, a value of 520 was obtained at 1 GHz for the real part (μ') of the permeability, and a value of 15 was obtained at 1 GHz for the quality factor Q (Q=μ'/μ").

EXAMPLE 19

On the basis of the same manner as that in Example 10 except that the composition of the Co-based amorphous alloy layer was altered from $Co_{87}Zr_5Nb_8$ to $Co_{80}Fe_9Zr_3B_8$, a composite magnetic thin film (Example 19) of the present invention was formed.

On the basis of the methods in conformity with the above described examples, the physical property values of the composite magnetic thin film concerned were measured, and thus a saturation magnetization of 15.0 kG (1.50 T), an easy axis coercivity of 0.6 Oe (47.75 A/m), and a hard axis coercivity of 0.7 Oe (55.76 A/m) were obtained.

Additionally, a value of 530 was obtained at 1 GHz for the real part (μ') of the permeability, and a value of 17 was obtained at 1 GHz for the quality factor Q (Q=μ'/μ").

FIG. 25 collects the magnetic properties and the like of the magnetic thin films prepared in Examples 10 to 19 and Comparative Example 5.

As shown in FIG. 25, the respective examples according to the present invention can attain a saturation magnetization of 1.4 T or more, a resonance frequency of 1.5 GHz or more, and a Q value of 5.0 or more. Among these examples, Examples 10 to 13, 16, 17, 18 and 19 in which T1 falls within the range from 0.5 to 3.0 nm and T1/T2 falls within the range from 0.8 to 3.0 can attain a saturation magnetization of 1.4 T or more, a resonance frequency of 2.0 GHz or more, and a Q value of 10.0 or more.

EXAMPLES 20 TO 27

On the basis of the same manner as that in Example 1 except that the targets for use in thin film formation were the targets described below, the magnetic thin films shown in FIG. 26 were formed, and the physical properties thereof such as the magnetic properties and the like were measured. The results obtained are collected in FIG. 26.

For the magnetic thin films containing the Fe—Co—$C_5$ film, a composite target wherein C (carbon) pellets were arranged on an $Fe_{70}Co_{30}$ target was used. For the magnetic thin films containing the Fe—$B_5$ film, an $Fe_{95}B_5$ alloy target was used, and for the magnetic thin films containing the Fe—Co—$B_5$ film, a $Fe_{65}Co_{30}B_5$ alloy target was used. The magnetic thin films containing the Fe—$C_5$—$N_5$ film were prepared by introducing N (nitrogen) gas during sputtering using a composite target wherein C pellets were arranged on an Fe target, and the magnetic thin films containing the FeCo—$C_5$—$N_5$ film were prepared by introducing N (nitrogen) gas during sputtering using a composite target wherein C pellets were arranged on an $Fe_{70}Co_{30}$ target.

As shown by Example 20 in FIG. 26, by adopting the Fe—Co—$C_5$ film as the first film, as compared to Example 1 in which the Fe—$C_5$ film was adopted as the first film, the saturation magnetization and the real part of the permeability were improved.

Additionally, from Examples 21 to 25 in FIG. 26, it can be seen that for the first film, not only C but also B and/or N can be applied.

Yet additionally, from a comparison between Examples 20, 26 and 27 in FIG. 26, it can be seen that for the purpose of attaining particularly excellent properties, it is important to regulate both T1 and T1/T2.

INDUSTRIAL APPLICABILITY

As described above in detail, according to the present invention, a high frequency magnetic thin film which has a high saturation magnetization, and concurrently exhibits a high permeability and a high quality factor Q in the high frequency of GHz range can be provided.

The invention claimed is:

1. A high frequency magnetic thin film comprising:
   a first layer comprising a T-L composition (here, T is Fe or FeCo, L is B); and
   a second layer comprising a Co-based amorphous alloy arranged on either of the surfaces of said first layer wherein:
   said first layer has a bcc structure.

2. A high frequency magnetic thin film according to claim 1, wherein:
   a plurality of said first layers and one or more said second layers are laminated to form a multilayer film structure.

3. A high frequency magnetic thin film according to claim 1, wherein:
   the real part (μ') of the complex permeability at 1 GHz is 400 or more, the quality factor Q (μ'/μ") is 4 or more, and
   the saturation magnetization is 14 kG (1.4 T) or more.

4. A high frequency magnetic thin film according to claim 1, wherein:
   when T1 denotes the thickness of said first layer and T2 denotes the thickness of said second layer, T1 falls within the range from 3 to 70 nm and T1/T2 falls within the range from 0.15 to 3.50.

5. A high frequency magnetic thin film according to claim 1, wherein:
   the real part (μ') of the complex permeability at 1 GHz is 500 or more,
   the quality factor Q (μ'/μ") is 10 or more, and
   the saturation magnetization is 14 kG (1.4 T) or more.

6. A high frequency magnetic thin film according to claim 5, wherein:
   when T1 denotes the thickness of said first layer and T2 denotes the thickness of said second layer, the thickness of said first layer T1 falls within the range from 0.5 to 3.0 nm and T1/T2 falls within the range from 0.8 to 3.0.

7. A high frequency magnetic thin film according to 1, wherein:
said second layer is mainly composed of Co, and comprises at least one additional element selected from the group consisting of B, C, Si, Ti, V, Cr, Mn, Fe, Ni, Y, Zr, Nb, Mo, Hf, Ta and W.

8. A high frequency magnetic thin film according to 1, wherein:
said second layer is selected from the group consisting of CoZr, CoHf, CoNb, CoMo, CoZrNb, CoZrTa, CoFeZr, CoFeNb, CoTiNb, CoZrMo, CoFeB, CoZrNbMo, CoZrMoNi, CoFeZrB, CoFeSiB and CoZrCrMo.

9. A high frequency magnetic thin film according to claim 1, wherein:
the concentration of the element L contained in said first layer falls within the range from 2 to 20 at %.

10. A high frequency magnetic thin film according to claim 1, wherein:
a plurality of said first layers and a plurality of said second layers are laminated to form a multilayer film structure.

11. A high frequency magnetic thin film according to claim 1, wherein:
said L further comprises C.

12. A composite magnetic thin film, comprising:
a first layer which is mainly composed of Fe or FeCo and B, with the saturation magnetization of 16 kG (1.6 T) or more by itself, and said first layer is constituted with a columnar structure of 1.4 or less aspect ratio or an amorphous structure, and
a second layer which is mainly composed of Co, having the properties by itself that the permeability is 1,000 or more (the measurement frequency: 10 MHz), the saturation magnetization is 10 kG (1.0 T) or more, and the resistivity is 100 μΩ cm or more, wherein:
said first layer and said second layer are alternately laminated and
said first layer has a bcc structure.

13. A magnetic device comprising a high frequency magnetic thin film, wherein:
said high frequency magnetic thin film is a multilayer film wherein a first layer comprising a T-L composition (here, T is Fe or FeCo, L is B) and a second layer comprising a Co-based amorphous alloy arranged on either of the surfaces of said first layer are alternately laminated, wherein: said first layer has a bcc structure.

14. A magnetic device according to claim 13, wherein:
said magnetic device comprises said high frequency magnetic thin films arranged to face each other so as to sandwich a coil.

15. A magnetic device according to claim 14, wherein:
said magnetic device is an inductor or a transformer.

16. A magnetic device according to claim 14, wherein:
said magnetic device is an inductor used in a monolithic microwave integrated circuit.

17. A magnetic device according to claim 13, wherein:
said L further comprises C.

* * * * *